(12) United States Patent
Chen et al.

(10) Patent No.: US 12,237,814 B2
(45) Date of Patent: Feb. 25, 2025

(54) LOAD-MODULATED BALANCED AMPLIFIERS

(71) Applicant: University of Central Florida Research Foundation, Inc., Orlando, FL (US)

(72) Inventors: Kenle Chen, Oviedo, FL (US); Yuchen Cao, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 506 days.

(21) Appl. No.: 17/545,166

(22) Filed: Dec. 8, 2021

(65) Prior Publication Data
US 2022/0255507 A1 Aug. 11, 2022

Related U.S. Application Data

(60) Provisional application No. 63/146,864, filed on Feb. 8, 2021.

(51) Int. Cl.
| | | |
|---|---|---|
| H03F 1/07 | (2006.01) | |
| H03F 1/02 | (2006.01) | |
| H03F 1/56 | (2006.01) | |
| H03F 3/195 | (2006.01) | |
| H03F 3/24 | (2006.01) | |
| H03F 3/60 | (2006.01) | |

(52) U.S. Cl.
CPC ............ H03F 1/0288 (2013.01); H03F 1/56 (2013.01); H03F 3/195 (2013.01); H03F 3/245 (2013.01); H03F 3/602 (2013.01); *H03F 2200/451* (2013.01)

(58) Field of Classification Search
CPC .................................... H03F 1/02; H03F 1/07
USPC ............................................. 330/124 R, 295
See application file for complete search history.

(56) References Cited

U.S. PATENT DOCUMENTS

| | | | | |
|---|---|---|---|---|
| 8,400,216 | B2 * | 3/2013 | Jeong | H03F 1/0288 |
| | | | | 330/124 R |
| 10,404,224 | B2 | 9/2019 | Barton et al. | |
| 10,554,177 | B2 * | 2/2020 | Lyalin | H04B 1/40 |
| 11,190,143 | B2 * | 11/2021 | Pham | H03F 3/195 |
| 11,239,869 | B2 * | 2/2022 | Wang | H03F 3/245 |
| 11,283,410 | B2 * | 3/2022 | Bouisse | H03F 3/245 |
| 11,362,625 | B2 * | 6/2022 | Chen | H03F 3/195 |
| 11,888,448 | B2 * | 1/2024 | Pham | H03F 3/245 |
| 11,949,390 | B2 * | 4/2024 | Sharma | H03F 3/195 |

(Continued)

OTHER PUBLICATIONS

Afaqui, M.S, et al., "IEEE 802.11ax: Challenges and requirements for future high efficiency Wi-Fi," IEEE Wireless Commun., vol. 24, No. 3, pp. 130-137, Jun. 2017.

(Continued)

*Primary Examiner* — Henry Choe
(74) *Attorney, Agent, or Firm* — Meunier Carlin & Curfman LLC

(57) ABSTRACT

Described herein are load-modulated balanced amplifiers. An example load-modulated balanced amplifier can include a radio frequency (RF) input port, a RF output port, a peaking amplifier circuit operably coupled between the RF input and RF output ports, where the peaking amplifier circuit is a balanced amplifier that includes a pair of power amplifiers, and a carrier amplifier circuit operably coupled to the RF input port.

16 Claims, 24 Drawing Sheets

(56) References Cited

U.S. PATENT DOCUMENTS

| | | | | |
|---|---|---|---|---|
| 2013/0021104 | A1* | 1/2013 | Schmidt | H03F 1/0288 330/124 R |
| 2013/0314162 | A1* | 11/2013 | Schmidt | H03F 1/0288 330/295 |
| 2020/0204120 | A1* | 6/2020 | Zhang | H03F 1/3247 |

OTHER PUBLICATIONS

Andersson C.M., et al., "Theory and design of class-J power amplifiers with dynamic load modulation," IEEE Trans. Microw. Theory Techn., vol. 60, No. 12, pp. 3778-3786, Dec. 2012.

Banerjee, "High efficiency multi-mode outphasing RF power amplifier in 45nm CMOS," in Proc. ESSCIRC Conf. 41st Eur. Solid-State Circuits Conf. (ESSCIRC), Sep. 2015, pp. 168-171.

Barakat, A., et al., "Toward a more generalized Doherty power amplifier design for broadband operation," IEEE Trans. Microw. Theory Techn., vol. 65, No. 3, pp. 846-859, Mar. 2017.

Barthwal, A., et al., "A design strategy for bandwidth enhancement in three-stage Doherty power amplifier with extended dynamic range," IEEE Trans. Microw. Theory Techn., vol. 66, No. 2, pp. 1024-1033, Feb. 2018.

Barthwal, A., et al., "Wideband tri-stage Doherty power amplifier with asymmetric current ratios," in Proc. IEEE MTT-S Int. Microw. RF Conf. (IMaRC), Dec. 2016, pp. 1-4.

Beltran, R.A. "Broadband outphasing transmitter using Class-E power amplifiers," in IEEE MTT-S Int. Microw. Symp. Dig., Jun. 2019, pp. 67-70.

Camarchia, V., et al., "The Doherty power amplifier: Review of recent solutions and trends," IEEE Trans. Microw. Theory Techn., vol. 63, No. 2, pp. 559-571, Feb. 2015.

Cao, Y, et al., "Wideband Doherty power amplifier in quasi-balanced configuration," in Proc. IEEE 20th Wireless Microw. Technol. Conf. (WAMICON), Apr. 2019, pp. 1-4.

Cao, Y, et al., H. Lyu, and K. Chen, "Load modulated balanced amplifier with reconfigurable phase control for extended dynamic range," in IEEE MTTS Int. Microw. Symp. Dig., Jun. 2019, pp. 1335-1338.

Cao, Yuchen, and Kenle Chen. "Dual-Octave-Bandwidth RF-Input Pseudo-Doherty Load Modulated Balanced Amplifier with ≥10-dB Power Back-off Range." 2020 IEEE/MTT-S International Microwave Symposium (IMS). IEEE, 2020, 703-706.

Cao, Yuchen, and Kenle Chen. "Pseudo-Doherty load-modulated balanced amplifier with wide bandwidth and extended power back-off range." IEEE Transactions on Microwave Theory and Techniques 68.7 (2020): 3172-3183.

Cao, Yuchen, and Kenle Chen. Hybrid Asymmetrical Load Modulated Balanced Amplifier with Wide Bandwidth and Three-Way-Doherty Efficiency Enhancement. IEEE Microwave and Wireless Components Letters, Jun. 2021, 721-724.

Cao, Yuchen, and Lyu H., "Asymmetrical Load Modulated Balanced Amplifier With Continuum of Modulation Ratio and Dual-Octave Bandwidth." IEEE Transactions on Microwave Theory and Techniques. 69(1), 2021, 682-696.

Cao, Yuchen, and Lyu H., "Continuous-Mode Hybrid Asymmetrical Load-Modulated Balanced Amplifier with Three-Way Modulation and Multi-Band Reconfigurability", IEEE Trans. Circuits and Systems I: Regular Papers, Nov. 30, 2021, 13 pages.

Cappello, T., et al., "Supply- and load-modulated balanced amplifier for efficient broadband 5G base stations," IEEE Trans. Microw. Theory Techn., vol. 67, No. 7, pp. 3122-3133, Jul. 2019.

Cappello, T., et al., "Supply modulation of a broadband load modulated balanced amplifier," in IEEE MTT-S Int. Microw. Symp. Dig., Jun. 2018, pp. 304-307.

Chen, k., et al., "Design of adaptive highly efficient GaN power amplifier for octave-bandwidth application and dynamic load modulation," IEEE Trans. Microw. Theory Techn., vol. 60, No. 6, pp. 1829-1839, Jun. 2012.

Chen, K., et al., "Design of broadband highly efficient harmonic-tuned power amplifier using in-band continuous class-F-1/F mode transferring," IEEE Trans. Microw. Theory Techn., vol. 60, No. 12, pp. 4107-4116, Dec. 2012.

Chen, K., et al., "Design of highly efficient broadband class-E power amplifier using synthesized low-pass matching networks," IEEE Trans. Microw. Theory Techn., vol. 59, No. 12, pp. 3162-3173, Dec. 2011.

Chen, S. et la., "A reactance compensated three-device Doherty power amplifier for bandwidth and back-off range extension," Wireless Commun. Mobile Comput., vol. 2018, pp. 1-10, May 2018.

Chung, S., et al., "Asymmetric multilevel outphasing transmitter using class-E PAs with discrete pulse width modulation," in IEEE MTT-S Int. Microw. Symp. Dig., May 2010, pp. 264-267.

Collins, D., et al., Experimental characterization of a load modulated balanced amplifier with simplified input power splitter, in Proc. Asia-Pacific Microw. Conf. (APMC), Nov. 2018, pp. 461-463.

Darraji, R., et al., "Generalized theory and design methodology of wideband Doherty amplifiers applied to the realization of an octavebandwidth prototype," IEEE Trans. Microw. Theory Techn., vol. 65, No. 8, pp. 3014-3023, Aug. 2017.

Doherty, W.H., "A new high efficiency power amplifier for modulated waves," Proc. IRE, vol. 24, No. 9, pp. 1163-1182, Sep. 1936.

Hur J. et al., "A multilevel Class-D CMOS power amplifier for an outphasing transmitter with a nonisolated power combiner," IEEE Trans. Circuits Syst. II, Exp. Briefs, vol. 63, No. 7, pp. 618-622, Jul. 2016.

Innovative Power Products, NY, USA. 90 Degree Hybrid Couplers. Accessed: Sep. 15, 2019. [Online]. Available: https://innovativepp.com/product/ipp-7109/.

Jang, H, et al., "Asymmetric Doherty power amplifier designed using model-based nonlinear embedding," IEEE Trans. Microw. Theory Techn., vol. 62, No. 12, pp. 3436-3451, Dec. 2014.

Jeon H., et al., "A triple-mode balanced linear CMOS power amplifier using a switched-quadrature coupler," IEEE J. Solid-State Circuits, vol. 47, No. 9, pp. 2019-2032, Sep. 2012.

Kim, J., et al., B "Power efficiency and linearity enhancement using optimized asymmetrical Doherty power amplifiers," IEEE Trans. Microw. Theory Techn., vol. 59, No. 2, pp. 425-434, Feb. 2011.

Liu, B., et al., "A fully integrated class-J GaN MMIC power amplifier for 5-GHz WLAN 802.11ax application," IEEE Microw. Wireless Compon. Lett., vol. 28, No. 5, pp. 434-436, May 2018.

Lyu, H., et al., "Hybrid Load-Modulated Balanced Amplifier With High Linearity and Extended Dynamic Range", IEEE Microwave and Wireless Components Letters, vol. 31, No. 9, Sep. 2021, 1067-1070.

Merrick, B., et al., "A wideband sequential power amplifier," in IEEE MTT-S Int. Microw. Symp. Dig., Jun. 2014, pp. 1-3.

Muraguchi, M., et al., "Optimum design of 3-Db branch-line couplers using microstrip lines," IEEE Trans. Microw. Theory Techn., vol. MTT-31, No. 8, pp. 674-678, Aug. 1983.

Nemati, H. M., et al., "Design of highly efficient load modulation transmitter for wideband cellular applications," IEEE Trans. Microw. Theory Techn., vol. 58, No. 11, pp. 2820-2828, Nov. 2010.

Nemati, H. M., et al., "Design of varactor-based tunable matching networks for dynamic load modulation of high power amplifiers," IEEE Trans. Microw. Theory Techn., vol. 57, No. 5, pp. 1110-1118, May 2009.

Nghiem, X. A., et al., "Broadband sequential power amplifier with Doherty-type active load modulation," IEEE Trans. Microw. Theory Techn., vol. 63, No. 9, pp. 2821-2832, Sep. 2015.

Niclas, K.B., et al., "Application of the two-way balanced amplifier concept to wide-band power amplification using GaAs MESFET's," IEEE Trans. Microw. Theory Techn., vol. 28, No. 3, pp. 172-179, Mar. 1980.

Oh H., et al., "Doherty power amplifier based on the fundamental current ratio for asymmetric cells," IEEE Trans. Microw. Theory Techn., vol. 65, No. 11, pp. 4190-4197, Nov. 2017.

Pang, J., et al., "Analysis and Design of Highly Efficient Wideband RF-Input Sequential Load Modulated Balanced Power Amplifier", IEEE Transactions on Microwave Theory and Techniques, vol. 68, No. 5, May 2020, 1741-1753.

(56) References Cited

OTHER PUBLICATIONS

Pang, J., et al., "Broadband RF-Input Continuous-Mode Load-Modulated Balanced Power Amplifier with Input Phase Adjustment", IEEE Transactions on Microwave Theory and Techniques, vol. 68, No. 10, Oct. 2020, 4466-4478.

Pednekar, P.H, et al., "Analysis and design of a Doherty-like RF-input load modulated balanced amplifier," IEEE Trans. Microw. Theory Techn., vol. 66, No. 12, pp. 5322-5335, Dec. 2018.

Pednekar, p. H., et al., "RF-input load modulated balanced amplifier," in IEEE MTT-S Int. Microw. Symp., Jun. 2017, pp. 1730-1733.

Pednekar, p. H., et al., "RF-input load modulated balanced amplifier with octave bandwidth," IEEE Trans. Microw. Theory Techn., vol. 65, No. 12, pp. 5181-5191, Dec. 2017.

Quaglia R., et al., "A load modulated balanced amplifier for telecom applications," IEEE Trans. Microw. Theory Techn., vol. 66, No. 3, pp. 1328-1338, Mar. 2018.

Rubio, M. J. et al., "Design of an 87% fractional bandwidth Doherty power amplifier supported by a simplified bandwidth estimation method," IEEE Trans. Microw. Theory Techn., vol. 66, No. 3, pp. 1319-1327, Mar. 2018.

Saad, P., et al."Design of a highly efficient 2-4-GHz octave bandwidth GaN-HEMT power amplifier," IEEE Trans. Microw. Theory Techn., vol. 58, No. 7, pp. 1677-1685, Jul. 2010.

Saad, P., et al., "A 1.8-3.8-GHz power amplifier with 40% efficiency at 8-dB power back-off," IEEE Trans. Microw. Theory Techn., vol. 66, No. 11, pp. 4870-4882, Nov. 2018.

Saad, P., et al., "The continuum of load modulation ratio from Doherty to traveling-wave amplifiers," IEEE Trans. Microw. Theory Techn., vol. 67, No. 12, pp. 5101-5113, Dec. 2019.

Sanchez-Perez, C., et al., "Optimized design of a dual-band power amplifier with SiC varactor-based dynamic load modulation," IEEE Trans. Microw. Theory Techn., vol. 63, No. 8, pp. 2579-2588, Aug. 2015.

Shepphard, D. J., et al., "An efficient broadband reconfigurable power amplifier using active load modulation," IEEE Microw. Wireless Compon. Lett., vol. 26, No. 6, pp. 443-445, Jun. 2016.

Shepphard, D.J., et al., "A broadband reconfigurable load modulated balanced amplifier (LMBA)," in IEEE MTT-S Int. Microw. Symp. Dig., Jun. 2017, pp. 947-949.

Weitzel, C.E. "RF power amplifiers for wireless communications," in 24th Annu. Tech. Dig. Gallium Arsenide Integr. Circuit (GaAs IC) Symposiu, 2002, 4 pages.

Wu, R., et al., "High efficiency silicon-based envelope-tracking power amplifier design with envelope shaping for broadband wireless applications," IEEE J. Solid-State Circuits, vol. 48, No. 9, pp. 2030-2040, Sep. 2013.

Xia, J, et al., "High-efficiency GaN Doherty power amplifier for 100-MHz LTE-advanced application based on modified load modulation network," IEEE Trans. Microw. Theory Techn., vol. 61, No. 8, pp. 2911-2921, Aug. 2013.

Xia, J., et al., "Improved Doherty amplifier design with minimum phase delay in output matching network for wideband application," IEEE Microw. Wireless Compon. Lett., vol. 26, No. 11, pp. 915-917, Nov. 2016.

Xia, J., et al., "Improved threestage Doherty amplifier design with impedance compensation in load combiner for broadband applications," IEEE Trans. Microw. Theory Techn., vol. 67, No. 2, pp. 778-786, Feb. 2019.

Xu, Y., et al., "Three-Stage Load Modulated Power Amplifier With Efficiency Enhancement at Power Back-Off", IEEE Transactions on Microwave Theory and Techniques, vol. 69, No. 6, Jun. 2021, 3107-3119.

\* cited by examiner

TABLE I
STATE OF THE ART OF WIDEBAND LOAD-MODULATED PAs

| Ref. / Year | Architecture | Freq. (GHz) | FBW (%) | $P_{Max}$ (dBm) | DE @ $P_{Max}$ (%) | DE @ IBO (%) | DE @ LBO (%) |
|---|---|---|---|---|---|---|---|
| [49] 2018 | 3-Way DPA | 0.6-0.9 | 40 | 46.1-46.9 | 51-78 | 51.9-66.2@6 dB | 42.6-64@9.5 dB* |
| [21] 2018 | 3-Way DPA | 2.0-2.6 | 26 | 43.6-45.4 | 53-76 | 45-55@6 dB | 41-48@8 dB |
| [22] 2019 | 3-Way DPA | 1.6-2.6 | 48 | 45.5-46 | 53-66 | 52-66@6 dB | 50-53@9.5 dB |
| [40] 2016 | DPA | 1.6-2.2 | 31.6 | 46-47 | 60-71 | 50-55@6 dB* | 51.5-55@10 dB |
| [50] 2018 | DPA | 1.5-3.8 | 86.8 | 42.3-43.4 | 42-63 | 33-55@6 dB | 22-40@10 dB* |
| [20] 2019 | DEPA | 2.55-3.8 | 40 | 48.8-49.8 | 54-67 | 42-53@6 dB* | 47-60@8 dB |
| [41] 2017 | Dual-Input LMBA | 4.5-7.5 | 50 | 39 | 47-77* | 28-60@6 dB* | 40-72@10 dB*† |
| [42] 2018 | Dual-Input LMBA | 1.7-2.5 | 38 | 48-48.9 | 48-58* | 43-53@6 dB* | 33-45@10 dB*† |
| [24] 2017 | RF-Input LMBA | 0.7-0.85 | 19 | 42 | 57-70 | 34-48@6 dB | 30-35@10 dB*† |
| [29] 2017 | RF-Input LMBA | 1.8-3.8 | 71 | 44 | 46-70 | 33-59@6 dB | 20-25@10 dB*† |
| This Work | PD-LMBA | 1.5-2.7 | 57 | 45 | 58-72 | 47-61@6 dB | 47-58@10 dB |

* Graphically estimated, † PAE, ‡ with reduced $V_{DD}$.

*FIG. 20C*

LOAD-MODULATED BALANCED AMPLIFIERS

CROSS-REFERENCE TO RELATED APPLICATIONS

This application claims the benefit of U.S. provisional patent application No. 63/146,864, filed on Feb. 8, 2021, and titled "LOAD-MODULATED BALANCED AMPLIFIERS," the disclosure of which is expressly incorporated herein by reference in its entirety.

STATEMENT REGARDING FEDERALLY FUNDED RESEARCH

This invention was made with government support under Grant no. 1914875 awarded by the National Science Foundation. The government has certain rights in the invention.

BACKGROUND

The rapid evolution of wireless communications in the modern world has led to ever-increasing demands on higher data rates and lower system latency in communication links. Due to the scarcity of spectrum resources, the spectrum-efficient modulation schemes, such as high-order quadrature amplitude modulation (e.g., 1024QAM) and orthogonal frequency-division multiplexing (OFDM), have been widely exploited in cellular and wireless local area network (WLAN) communications systems. Besides the benefits of those techniques, they have also led to a substantial increase of peak-to-average power ratio (PAPR) of signals, e.g., 7-8 dB in 4G versus >9.5 dB in 5G and WLAN IEEE 802.11ax. Amplification of such high-PAPR signals makes power amplifiers (PAs) suffer from substantial efficiency degradation. On the other hand, due to the communications band proliferation, the wireless spectrum has been significantly expanding toward higher frequencies beyond the conventional range from 0.7 to 2.7 GHz in the 2G-4G era. As a result, the operational bandwidth of a single PA is desired to be as wide as possible, in order to minimize the number of PAs on a wireless platform for reducing the cost, space, and system complexity.

Enhancement of PA efficiency can rely on two types of techniques, i.e., supply modulation (also known as envelope tracking) and load modulation. Given the bandwidth limitation and complexity in system operation of envelope tracking, load modulation has attracted increasing interest, and a variety of load-modulation architectures have been proposed and employed in realistic systems, including Doherty PA (DPA), out-phasing PA, and varactor-based dynamic load modulation. However, conventional load-modulation techniques are facing difficulties in efficiently transmitting the high-PAPR signals and in extending to wider bandwidth. For example, the standard DPA only offers 6 dB of back-off power range, while the bandwidth is strongly limited by the quarter-wave inverter embedded in its circuit schematic. Despite recent advances in terms of wideband asymmetrical DPAs, distributed DPAs, and multiway DPAs, maintaining maximized efficiency over extended power back-off and meanwhile over broadened frequency span still remains a major challenge. Therefore, to enable energy-efficient and wideband communications for future generations, a new types of load-modulation PA that fundamentally break the efficiency-bandwidth compromise are desired.

SUMMARY

The present disclosure pertains to load-modulated balanced amplifiers. An example load-modulated balanced amplifier is described herein. The load-modulated balanced amplifier can include a radio frequency (RF) input port, a RF output port, a peaking amplifier circuit operably coupled between the RF input and RF output ports, where the peaking amplifier circuit is a balanced amplifier that includes a pair of power amplifiers, and a carrier amplifier circuit operably coupled to the RF input port.

In some implementations, the carrier amplifier circuit is configured to provide gain at any power level of an input RF signal.

In some implementations, the peaking amplifier circuit is configured to provide gain only at peak power levels of an input RF signal.

In some implementations, the load-modulated balanced amplifier is configured for load modulation from peak power to a predefined output power back-off. Optionally, the predefined output power back-off is about −10 decibel (dB).

In some implementations, the pair of power amplifiers of the peaking amplifier circuit are coupled through first and second quadrature couplers. Optionally, the pair of power amplifiers are coupled 90° out-of-phase through the first and second quadrature couplers. Alternatively or additionally, an input port of the first quadrature coupler is configured to receive an input RF signal. Alternatively or additionally, the carrier amplifier circuit is operably coupled between the RF input port and an isolation port of the second quadrature coupler. Alternatively or additionally, each of the first and second quadrature couplers is a branch-line coupler, a coupled-line coupler, a Lange coupler, a transformer-based coupler, or a lumped coupler comprising inductors and capacitors.

In some implementations, the load-modulated balanced amplifier further includes a phase shifter, where the peaking amplifier circuit is operably coupled to the RF input through the phase shifter. Optionally, the phase shifter is a transmission line that is configured to provide an optimal frequency-dependent phase offset between the carrier and peaking amplifier circuits over an operational frequency range. Alternatively or additionally, a relative phase difference between the carrier and peaking amplifier circuits is offset by a given length of the transmission line. In some implementations, the phase shifter is a fixed or tunable phase shifter. Optionally, the phase shifter is a transmission line, a bandpass filter, a low-pass filter, a high-pass filter, or a network comprising inductors, capacitors, and/or resistors.

In some implementations, the power divider is configured to split an input RF signal between the carrier and peaking amplifier circuits.

In some implementations, the carrier amplifier circuit comprises a Class AB power amplifier. Alternatively, the carrier amplifier circuit comprises a Class A power amplifier or a Class B power amplifier.

In some implementations, each of the pair of power amplifiers of the peaking amplifier circuit is a Class C power amplifier.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

FIG. 5A illustrates the case where $P_{OUT} < P_{Max}/OBO$ and FIG. 5B illustrates the case where POUT≥PMax/OBO.

FIGS. 20A-20C illustrate performance characteristics of implementations described herein. FIGS. 20A-20B illustrate power-swept measurements of efficiency and gain from 1.5 to 2.7 GHZ according to implementations described herein. FIG. 20C is Table 1 which compares the characteristics of an implementation of the present disclosure to other circuit architectures.

DETAILED DESCRIPTION

Figure 1:
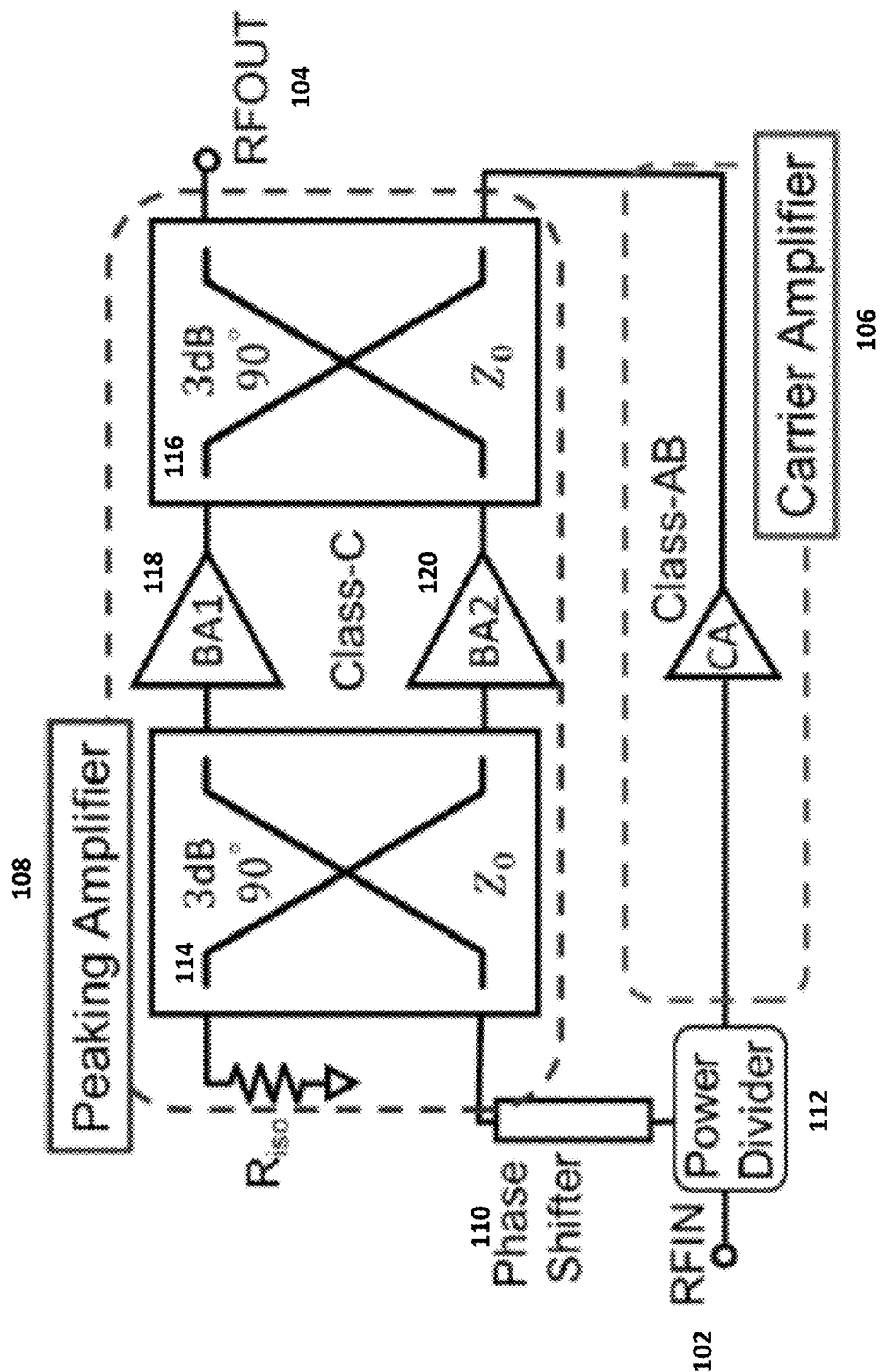
FIG. 1 illustrates a schematic of a pseudo-Doherty load-modulated balanced amplifier (PD-LMBA) according to one implementation described herein.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Implementations described herein include an architecture of load-modulated balanced amplifier (LMBA) with a load-modulation characteristic different from any existing LMBAs and Doherty power amplifiers (DPAs). Throughout the present disclosure, the term pseudo-Doherty LMBA (PD-LMBA) is used to refer to these implementations. Based on a special combination of control amplifier (carrier) and balanced amplifier (peaking) together with proper phase and amplitude controls, an optimal load-modulation behavior can be achieved for PD-LMBA, leading to maximized efficiency over extended power back-off range. More importantly, the efficiency optimization can be achieved with only a static setting of phase offset at a given frequency, which greatly simplifies the complexity for phase control. Furthermore, the cooperation of the carrier and peaking amplifiers in PD-LMBA are fully decoupled, thus lifting the fundamental bandwidth barrier imposed on the Doherty-based active load modulation. An example implementation of a wideband RF-input PD-LMBA was physically developed using the GaN technology and disclosed herein. This example PD-LMBA achieves a highly efficient performance from 1.5 to 2.7 GHZ, e.g., 58%-72% of efficiency at 42.5-dBm peak power and 47%-58% at 10-dB output back-off (OBO). When stimulated by a 10-MHz long term evolution (LTE) signal with a 9.5-dB peak-to-average power ratio (PAPR), the example PD-LMBA achieves an efficiency of 44%-53% over the entire bandwidth at an average output power of around 33 dBm.

The power amplifier (PA) is the most power consuming module in any wireless platforms, and it predominantly influences the system features including power consumption, energy efficiency, temperature and bandwidth. The present disclosure includes a load modulation power amplifier platform, named pseudo-Doherty load modulated balanced amplifier (PD-LMBA). Based on a combination of control amplifier (carrier) and balanced amplifier (peaking) together with proper phase and amplitude controls, an optimal load-modulation behavior can be achieved for PD-LMBA, leading to maximized efficiency over extended power back-off range. Meanwhile, with the disclosed phase control method, unlimited bandwidth of this load modulation PA is achieved. This architecture exhibits an ideal solution for the current and future energy-efficiency, multi-band, and multi-mode radio transmitters. In some implementations, the present disclosure relates to a PD-LMBA with a balanced amplifier (BA) including two quadrature-coupled sub-amplifiers and a control amplifier (CA).

Features of such PD-LMBA can include, but are not limited to: 1) the CA is biased in Class-AB above the threshold of transistor, and the BA is biased in Class-C below the transistors' threshold; 2) transmission lines or equivalent circuits are added at the input of BA and CA for phase-delay control; and 3) the power of CA is made smaller than the power of BA through smaller size of CA device and/or smaller supply voltage of CA. Additionally, such PD-LMBA can have benefits including, but not limited to: 1) the operational bandwidth is nearly unlimited, which is a major benefit as compared to conventional Doherty PA and generic LMBA without PD bias, and 2) load modulation can be achieved with enhanced efficiency over extended dynamic power range, which can be well suited for amplification of the emerging wireless signals, e.g., 4G, 5G, and beyond.

Figure 2:
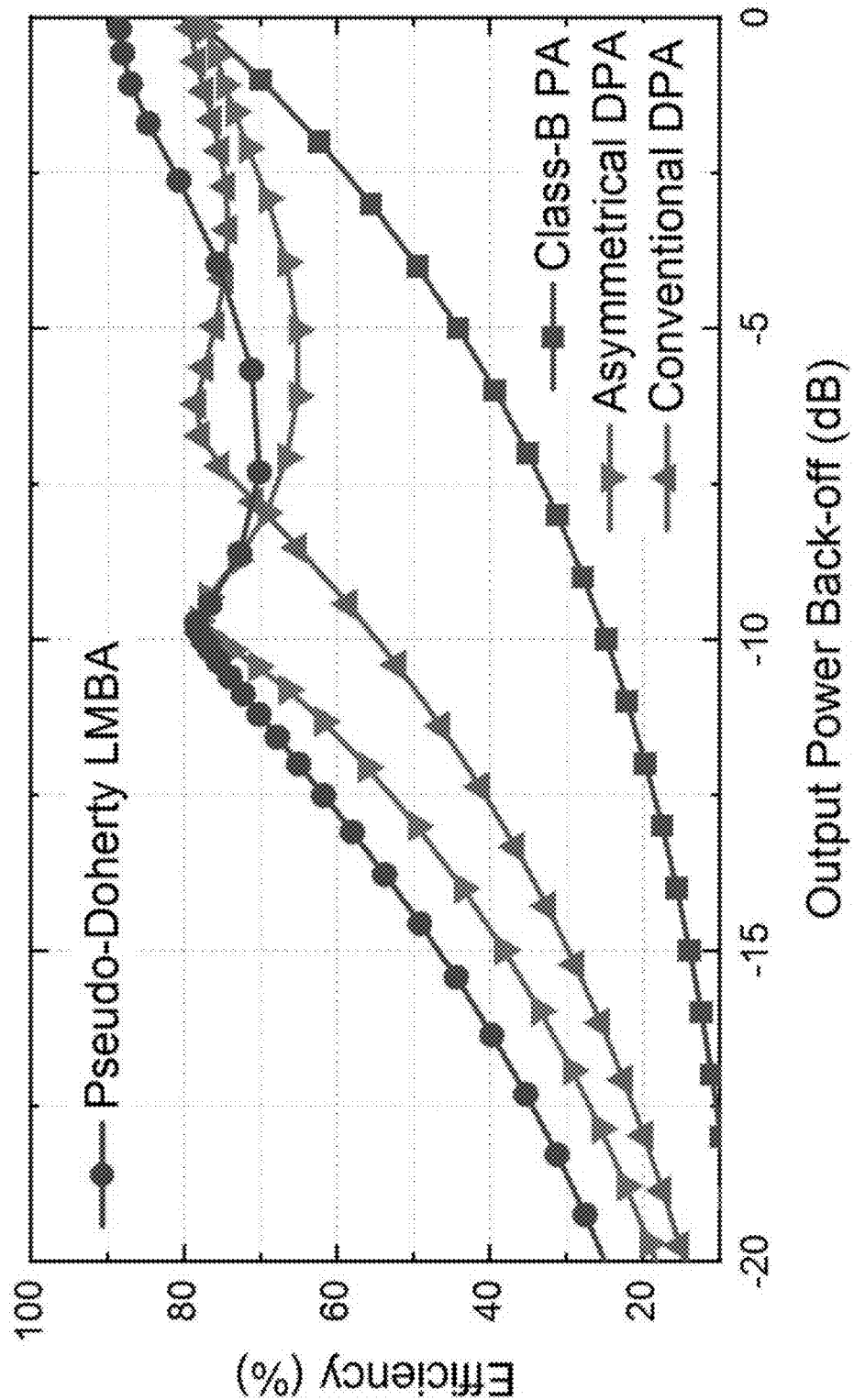
FIG. 2 illustrates a simulated efficiency profile comparison between a Class-B amplifier, conventional DPA, asymmetrical DPA, and the PD-LMBA shown in FIG. 1. The simulation was based on bare-die GaN devices in order to emulate the ideal transistor models.

FIG. 1 illustrates a schematic of an implementation of a PD-LMBA according to one implementation described herein. By setting the balanced amplifier (BA) as the peaking and the control amplifier (CA) as the carrier, a unique Doherty-like LMBA mode can be attained, described herein as pseudo-Doherty LMBA (PD-LMBA). The operations of BA and CA in this redefined LMBA are functionally independent and decoupled. This load-modulation mechanism circumvents the difficulties in wideband implementation of active load modulations, e.g., Doherty or out phasing, which are all based on coupled interaction between multiple amplifiers. Moreover, with proper settings of BA-CA power scaling ratio and phase offset, the power back-off range of PD-LMBA can be greatly extended beyond the 6 dB of conventional DPA without compensating the back-off efficiency such as asymmetrical DPA, as shown in FIG. 2.

Meanwhile, it is important to emphasize that at a given frequency, the optimized back-off efficiency can be achieved with only a static setting of phase offset, and the wideband phase shifting between BA and CA can be easily implemented using a transmission line (TL). These features minimize the circuit and system complexity.

With reference to FIG. 1, the PD-LMBA includes an RF input port 102, an RF output port 104, a carrier amplifier circuit 106, and a peaking amplifier circuit 108. The carrier amplifier circuit 106 is configured to provide gain at any power level of an input RF signal, while the peaking amplifier circuit 108 is configured to provide gain only at peak power levels of an input RF signal.

In FIG. 1, the peaking amplifier circuit 108 is operably coupled between the RF input and RF output ports 102 and 104. The peaking amplifier circuit 108 is a balanced amplifier that includes a pair of power amplifiers BA1 118 and BA2 120. The pair of power amplifiers BA1 118 and BA2 120 are coupled through first and second quadrature couplers QC1 114 and QC2 116. QC1 114 is the input quadrature coupler and QC2 116 is the output quadrature coupler. Each of the first and second quadrature couplers 114 and 116 can be a branch-line coupler, a coupled-line coupler, a Lange coupler, a transformer-based coupler, or a lumped coupler with inductors and capacitors. It should be understood that the couplers provided above are only examples. This disclosure contemplates that the first and second quadrature couplers 114 and 116 can be, include, and/or be made from other circuit components. As shown in FIG. 1, the pair of power amplifiers BA1 118 and BA2 120 are coupled 90° out-of-phase through the quadrature couplers QC1 114 and QC2 116. In FIG. 1, each of the pair of power amplifiers BA1 118 and BA2 120 is a Class C power amplifier.

Additionally, in FIG. 1, the carrier amplifier circuit 106 includes a Class AB power amplifier. In other implementations, this disclosure contemplates that the carrier amplifier circuit 106 can include a Class A power amplifier or a Class B power amplifier. Additionally, the carrier amplifier circuit 106 is operably coupled to the input port 102. In particular, the carrier amplifier circuit 106 is operably coupled between the input port 102 and an isolation port of the second quadrature coupler QC2 116 as shown in FIG. 1.

The input port 102 can be configured to accept a radiofrequency (RF) signal. The input port 102 can optionally be operably connected to a power divider 112, which is configured to split the input RF signal between the carrier and peaking amplifier circuits 106 and 108. The power divider 112 can be a dedicated power divider 112, and the power dividing ratio can be adapted to control the amplitude of the signal that is passed through the power divider 112 to the carrier amplifier circuit 106 and to the peaking amplifier circuit 108, e.g., via an input port of the first quadrature coupler QC1 114.

The PD-LMBA can also include a phase shifter 110. Optionally, the power divider 112 can be operably connected to the phase shifter 110. In some implementations, the phase shifter 110 is a transmission line. The phase shifter 110 can be configured to provide an optimal frequency-dependent phase offset between the carrier amplifier circuit 106 and peaking amplifier circuit 108 over an operational frequency range (e.g., about 1.2 to 3 Gigahertz (GHz)). As described in the examples below, the length and/or width of the transmission line can be tuned to achieve the desired frequency-dependent phase offset. Although a transmission line is provided as an example phase shifter 110, this disclosure contemplates that the phase shifter 110 can be another equivalent component configured to provide an optimal frequency-dependent phase offset. For example, this disclosure contemplates that the phase shifter 110 can be, include, and/or be made from at least one of a transmission line, a bandpass filter, a low-pass filter, a high-pass filter, or a network comprising inductors, capacitors, and/or resistors.

FIG. 2 illustrates a simulated efficiency profile comparison between a Class-B amplifier, conventional DPA, asymmetrical DPA, and the PD-LMBA shown in FIG. 1. The simulation was based on bare-die GaN devices in order to emulate the ideal transistor models. The efficiency profile illustrated in FIG. 2 illustrates the relationship between the efficiency percentage and the Output Power Back-off (in dB) for the simulated amplifiers. For example, the PD-LMBA shown in FIG. 1 is configured for load modulation from peak power to about-10-decibel (dB) output power back-off.

It should be understood that the PD-LMBA shown in FIG. 1 and described above is provided only as an example. This disclosure contemplates that a PD-LMBA can have other configurations in accordance with this disclosure. Example PD-LMBAs with alternative configurations are shown in FIGS. 3 and 4.

Figure 3:
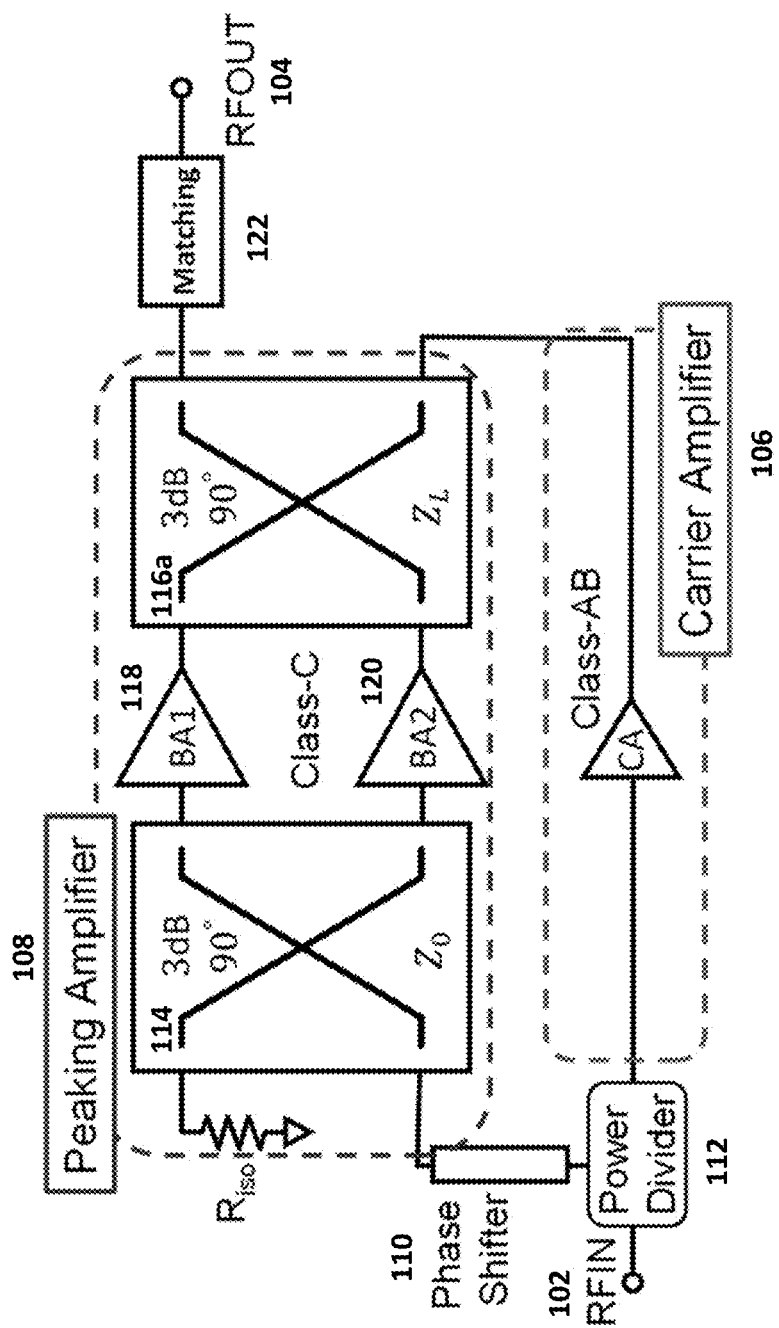
FIG. 3 is a schematic of a PD-LMBA configured for impedance matching according to another implementation described herein.
Figure 4:
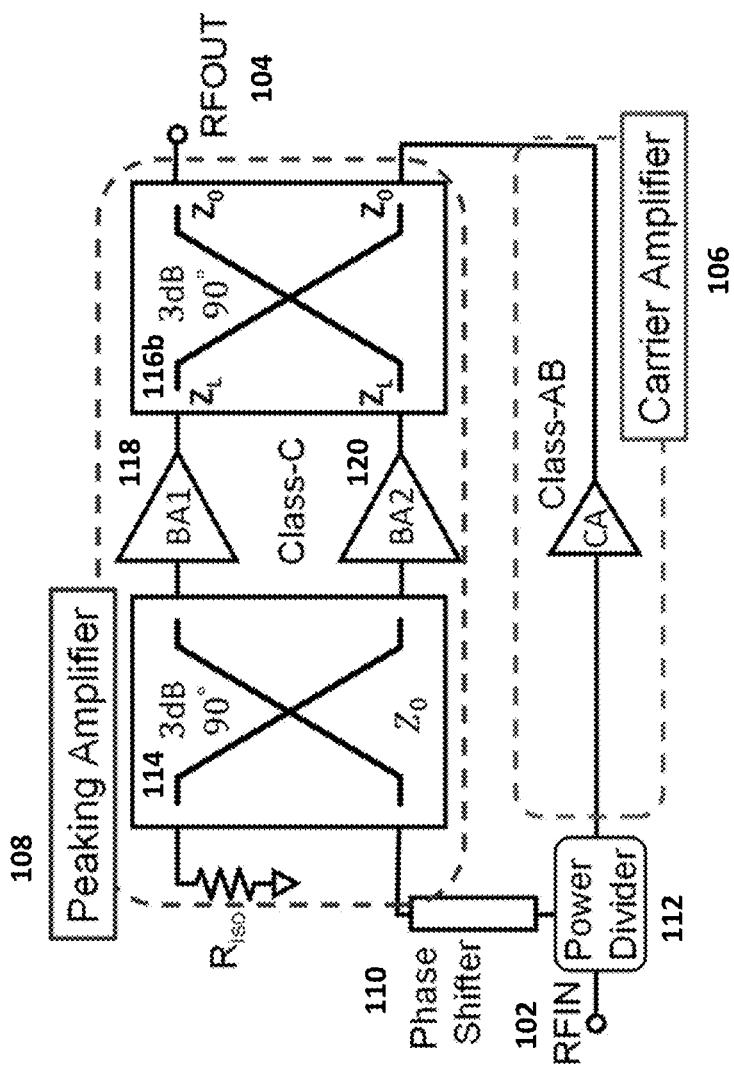
FIG. 4 is a schematic of a PD-LMBA configured for impedance matching according to yet another implementation described herein.

FIG. 3 illustrates a schematic of an implementation of a PD-LMBA according to another implementation described herein. As described below, the PD-LMBA of FIG. 3 differs from the PD-LMBA of FIG. 1 by including a non-Z0 quadrature coupler (i.e., the output quadrature coupler) and an impedance matching network. The PD-LMBA of FIG. 3, its components, and functionality are otherwise the same as the PD-LMBA of FIG. 1. The present disclosure also contemplates that the same coupler configuration as shown in FIG. 1 (e.g., coupler 114) can be applied to the input 102.

With reference to FIG. 3, the PD-LMBA includes an RF input port 102, an RF output port 104, a carrier amplifier circuit 106, and a peaking amplifier circuit 108. As described above, the carrier amplifier circuit 106 is configured to provide gain at any power level of an input RF signal, while the peaking amplifier circuit 108 is configured to provide gain only at peak power levels of an input RF signal.

In FIG. 3, the peaking amplifier circuit 108 is operably coupled between the RF input and RF output ports 102 and 104. The peaking amplifier circuit 108 is a balanced amplifier that includes a pair of power amplifiers BA1 118 and BA2 120. The pair of power amplifiers BA1 118 and BA2 120 are coupled 90° out-of-phase through first and second quadrature couplers QC1 114 and QC2 116a. QC1 114 is the input quadrature coupler and QC2 116a is the output quadrature coupler. Unlike the output quadrature coupler of PD-LMBA of FIG. 1, QC2 116a is a non-Z0 quadrature coupler. An impedance matching network 122 is also provided in the PD-LMBA of FIG. 3, for example, at the RF output 104. The impedance matching network 122 can include one or more inductors, capacitors, resistors, transformers, or other electrical components that provide for impedance matching.

Additionally, in FIG. 3, the carrier amplifier circuit 106 is operably coupled to the input port 102. In particular, the carrier amplifier circuit 106 is operably coupled between the input port 102 and an isolation port of the second quadrature coupler QC2 116a as shown in FIG. 3. The input port 102 can be configured to accept a radiofrequency (RF) signal. The input port 102 can optionally be operably connected to a power divider 112, which is configured to split the input RF signal between the carrier and peaking amplifier circuits 106 and 108. The power divider 112 can be a dedicated power divider 112, and the power dividing ratio can be adapted to control the amplitude of the signal that is passed through the power divider 112 to the carrier amplifier circuit 106 and to the peaking amplifier circuit 108, e.g., via an input port of the first quadrature coupler QC1 114. The PD-LMBA of FIG. 3 can also include a phase shifter 110. Optionally, the power divider 112 can be operably connected to the phase shifter 110.

FIG. 4 illustrates a schematic of an implementation of a PD-LMBA according to yet another implementation described herein. As described below, the PD-LMBA of FIG. 4 differs from the PD-LMBA of FIG. 1 by including an impedance matching quadrature coupler (i.e., the output quadrature coupler). The PD-LMBA of FIG. 4, its components, and functionality are otherwise the same as the PD-LMBA of FIG. 1. Again, the present disclosure also contemplates that the same coupler configuration (e.g., coupler 114) can be applied to the input 102.

With reference to FIG. 4, the PD-LMBA includes an RF input port 102, an RF output port 104, a carrier amplifier circuit 106, and a peaking amplifier circuit 108. As described above, the carrier amplifier circuit 106 is configured to provide gain at any power level of an input RF signal, while the peaking amplifier circuit 108 is configured to provide gain only at peak power levels of an input RF signal.

In FIG. 4, the peaking amplifier circuit 108 is operably coupled between the RF input and RF output ports 102 and 104. The peaking amplifier circuit 108 is a balanced amplifier that includes a pair of power amplifiers BA1 118 and BA2 120. The pair of power amplifiers BA1 118 and BA2 120 are coupled 90° out-of-phase through first and second quadrature couplers QC1 114 and QC2 116b. QC1 114 is the input quadrature coupler and QC2 116b is the output quadrature coupler. Unlike the output quadrature coupler of PD-LMBA of FIG. 1, QC2 116b is an impedance matching coupler, which provides for impedance matching.

Additionally, in FIG. 4, the carrier amplifier circuit 106 is operably coupled to the input port 102. In particular, the carrier amplifier circuit 106 is operably coupled between the input port 102 and an isolation port of the second quadrature coupler QC2 116b as shown in FIG. 4. The input port 102 can be configured to accept a radiofrequency (RF) signal. The input port 102 can optionally be operably connected to a power divider 112, which is configured to split the input RF signal between the carrier and peaking amplifier circuits 106 and 108. The power divider 112 can be a dedicated power divider 112, and the power dividing ratio can be adapted to control the amplitude of the signal that is passed through the power divider 112 to the carrier amplifier circuit 106 and to the peaking amplifier circuit 108, e.g., via an input port of the first quadrature coupler QC1 114. The PD-LMBA of FIG. 4 can also include a phase shifter 110. Optionally, the power divider 112 can be operably connected to the phase shifter 110.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary and are not intended to limit the disclosure. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Example 1

Simulated LBMA

Characteristics of example implementations of the present disclosure can be modeled using circuit simulation software. According to one implementation of the present disclosure, an LMBA is derived from a BA architecture with two amplifiers combined in 90° out-of-phase using two classical quadrature hybrids at input and output. Such an LMBA is shown in FIG. 1. In the Examples below, references are made to the LMBA shown in FIG. 1, which is also referred to herein as a PD-LMBA. The LMBA can differ from a standard BA in circuitry that the isolation port of the output coupler is not terminated to a resistor of characteristic impedance, $Z_0$, while a control signal is injected therein instead. With two symmetrical balanced amplifiers (e.g., BA1 118 and BA2 120) and the control signal, the behavior of LMBA can be considered as three excitation sources driving the output quadrature coupler, and it can be analytically described using the impedance matrix given by:

$$\begin{bmatrix} V_1 \\ V_2 \\ V_3 \\ V_4 \end{bmatrix} = Z_0 \begin{bmatrix} 0 & 0 & +j & -j\sqrt{2} \\ 0 & 0 & -j\sqrt{2} & +j \\ +j & -j\sqrt{2} & 0 & 0 \\ -j\sqrt{2} & +j & 0 & 0 \end{bmatrix} \begin{bmatrix} I_1 \\ I_2 \\ I_3 \\ I_4 \end{bmatrix} \quad (1)$$

where $I_2=I_b$ and $I_4=jI_b$ represent the input currents from BA1 118 and BA2 120 and $I_3=jI_ce^{j\theta}$ denotes the current from control signal source, as shown in FIG. 1.

Qualitatively speaking, due to the symmetry of quadrature coupler, the injected control signal is split equally into two halves appearing at the drain of the PA of each branch, which interacts with the output signals generated by these two branch PAs leading to load-modulation behavior. Using the matrix operation illustrated in (1), the impedances of BA1 118 and BA2 120 can be calculated as:

$$Z_{BA1} = Z_{BA2} = Z_0\left(1 + \frac{\sqrt{2}\,I_c e^{j\theta}}{I_b}\right) \quad (2)$$

where $I_b$ is the magnitude of BA currents, $I_c$ is the magnitude of CA current, and $\theta$ is the phase of the control path.

Figure 5:
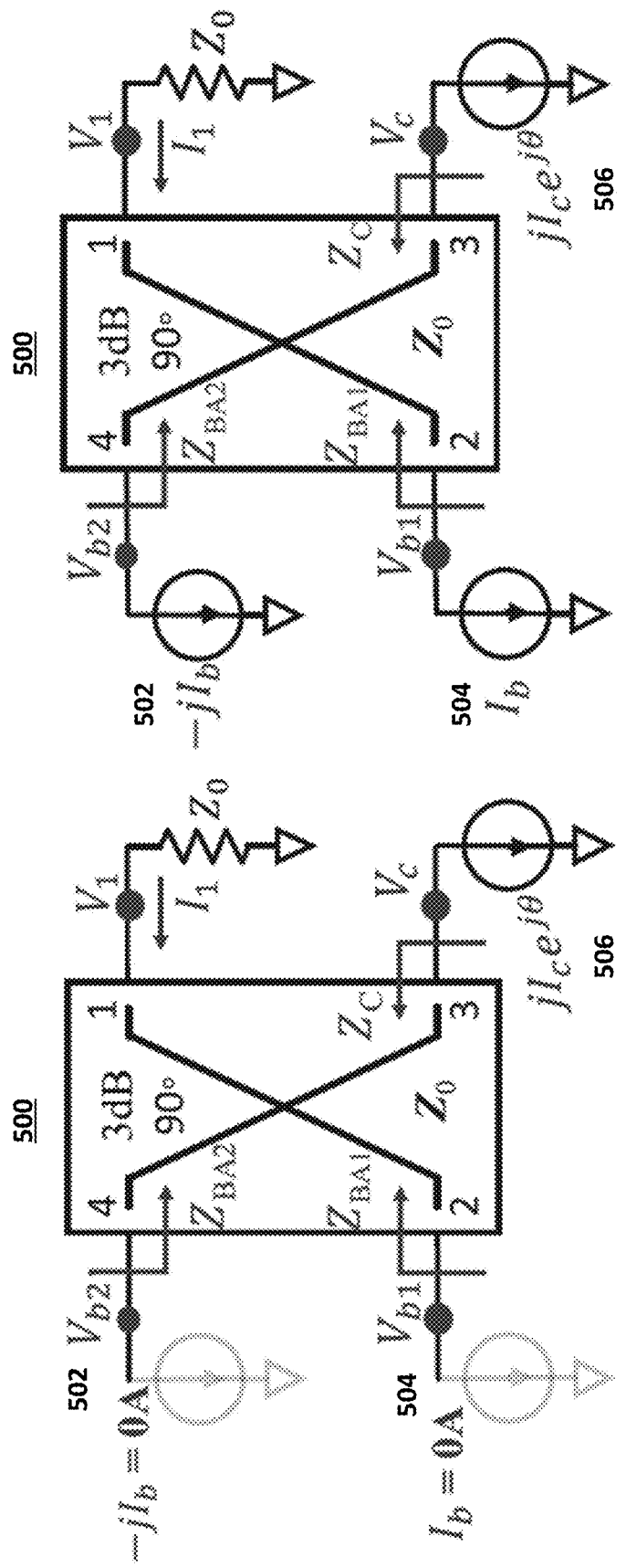
FIGS. 5A-5B are ideal generalized schematics of the output combining network for analyzing an implementation of the PD-LMBA architecture.

An RF-input LMBA uses a CA instead of an independent control signal power (CSP). The CA shares the same RF input with the BA, and the input power is split into BA and CA at a given ratio through a dedicated power divider. The CA supplies control power into the isolation port of the output coupler. The load impedance of BAs is dependent on both the power (i.e., current) and the phase of the control signal generated by CA 106. The operation of LMBA is primarily dependent on the following two aspects: 1) amplitude control of CA 106, which can be designed with proper power dividing ratio at the RF input node and the peak power ratio between BA and CA and 2) phase control of CA 106, which can be realized through a properly defined static phase offset, $\theta_0$, and a dynamically tunable phase $\Delta\theta$. FIGS. 5A and 5B illustrate an ideal generalized schematic of the output combining network 500 for analyzing implementations of the disclosed PD-LMBA architecture. In FIG. 5A, the $P_{OUT}<P_{Max}/OBO$, and in FIG. 5B, the $P_{OUT}$ is $\geq P_{Max}/OBO$. The input currents, $-jI_b$ 502 and $I_b$ 504 are illustrated in FIGS. 5A and 5B. Additionally, the current 506 from the control signal source ($jI_c e^{j\theta}$) is illustrated.

In some implementations of the present disclosure, the carrier-peaking combination of BA and CA can be swapped targeting for an extended range of output back-off (OBO), e.g., up to 10 dB, and enhanced back-off efficiency. To theoretically analyze the PD-LMBA, the operation can be divided into three regions, described below.

1) Low-Power Region ($P_{OUT}<P_{Max}/OBO$): When the PA is operating at low power level below the predefined target OBO power, the BA is completely turned off, i.e., $I_b=0$, as shown in FIG. 5A. In this case, the output power is only generated by the CA 106. According to (2), the impedances of BA1 118 and BA2 120 are thus equal to ∞; a further derivation using the matrix operation in (1) indicates a CA 106 impedance of $Z_0$ $$Z_{BA1,LP} = Z_{BA2,LP} = \infty$$

$$Z_{C,LP} = Z_0 \quad (3)$$

In this region, the overall LMBA efficiency is equal to the efficiency of CA 106, which increases toward maximum as the CA 106 power saturates at the target OBO power.

2) Back-Off Region ($P_{Max}/OBO \leq P_{OUT}<P_{Max}$): Once the power is increased to the target OBO level, the CA 106 should reach to its saturation, leading to $I_c=I_{c,Max}$. As the power further increases, the BA is turned on and $I_b$ starts to increase from 0 toward $I_{b,Max}$, as shown in FIG. 5B. Since the loading of CA 106 remains to be $Z_0$ as calculated using (1), the saturation of CA 106 is maintained, while $I_c$ remains its maximum value of $I_{c,Max}$. In this back-off region, the load-modulation behavior of BA1 118 and BA2 120 as well as the CA 106 impedance are given by:

$$Z_{BA1,BO} = Z_{BA2,BO} = Z_0\left(1 + \frac{\sqrt{2}\,I_{c,Max}e^{j\theta}}{I_b}\right) \quad (4)$$

$$Z_{C,BO} = Z_0$$

In this region, the CA 106 remains saturated with the highest efficiency, while BA's efficiency can also be significantly boosted through load modulation. As a result, an enhanced back-off efficiency of the overall LMBA can be achieved.

3) Saturation Region ($P_{OUT}=P_{Max}$): As the power increases to the saturation of BA, the CA 106 and BA can be saturated simultaneously. In this condition, the saturation load impedances of BA1 118, BA2 120, and CA 106 are as follows:

$$Z_{BA1,SAT} = Z_{BA2,SAT} = Z_0\left(1 + \frac{\sqrt{2}\,I_{c,Max}e^{j\theta}}{I_{b,Max}}\right) \quad (5)$$

$$Z_{C,SAT} = Z_0$$

The ratio of $I_{c,Max}/I_{b,Max}$ can be dependent on the OBO range, and this ratio can become smaller as OBO increases. In some implementations, at this saturation region, the entire LMBA can achieve a maximum efficiency value.

In some implementations of the present disclosure, the loading of CA 106 can constantly $Z_0$ across all three regions. In comparison with Doherty PA, this feature can eliminate the requirement for an impedance inverter connected to the main amplifier in some implementations, fundamentally breaking the bandwidth limitation imposed on the Doherty PA. Meanwhile, unlike the main amplifier in some implementations of the Doherty PA, the load impedance of CA 106 can be unaffected by the OFF-state impedance of the peaking amplifier (i.e., BA), leading to significantly reduced complexity for a wide-band design in some implementations of the present disclosure. Compared to the sequential amplifier with no load modulation that compromises PA efficiency at $P_{Max}$, PD-LMBA realizes the BA load modulation through a special combination of BA and CA 106, which can maintain a high-efficiency throughout $P_{Max}$ and the target OBO. In some implementations of the PD-LMBA, operation can rely primarily on the amplitude and phase control of the main balanced amplifier through the CA 106, which is discussed in detail throughout these examples.

Amplitude Control of PD-LMBA

As indicated by (4), the amplitude control of PD-LMBA is mainly determined by the term of $I_{c,Max}/I_b$. In terms of the PD-LMBA operation, the BA needs to be turned on at the predetermined back-off power, where the CA 106 reaches to its saturation simultaneously. Using the ideal model in FIGS. 5A-5B, the current scaling ratio between CA 106 and BA is determined by the target OBO range $$\frac{1}{2}I_{c,Max}^2 \times Z_0 = \frac{\frac{1}{2}I_{c,Max}^2 \times Z_0 + 2 \times \left(\frac{1}{2}I_{b,Max}^2 \times R_{BA1,SAT}\right)}{OBO} \quad (6)$$

$$I_{b,Max} = \frac{\sqrt{2 \times OBO} - \sqrt{2}}{2} I_{c,Max}$$

In (6), $R_{BA1,SAT}$ is the real part of $Z_{BA1,SAT}$. Practically, this BA-CA current scaling ratio can be transformed to the scaling ratio of transistor sizes of BA and CA 106. After determination of $I_{c,Max}/I_{b,Max}$ according to a specific OBO (e.g., $I_{c,Max}/I_{b,Max}$=1/1.53 for 10 db of OBO), the amplitude control of the load modulation is governed by the turn-on point of BA. In some implementations of the present disclosure, this can depend on two main factors: 1) the gate bias voltage of the BA $V_{GS,BA}$ and 2) the power dividing ratio between BA and CA 106. These two factors can be considered together in the practical design.

Phase Control of PD-LMBA

Figure 6:
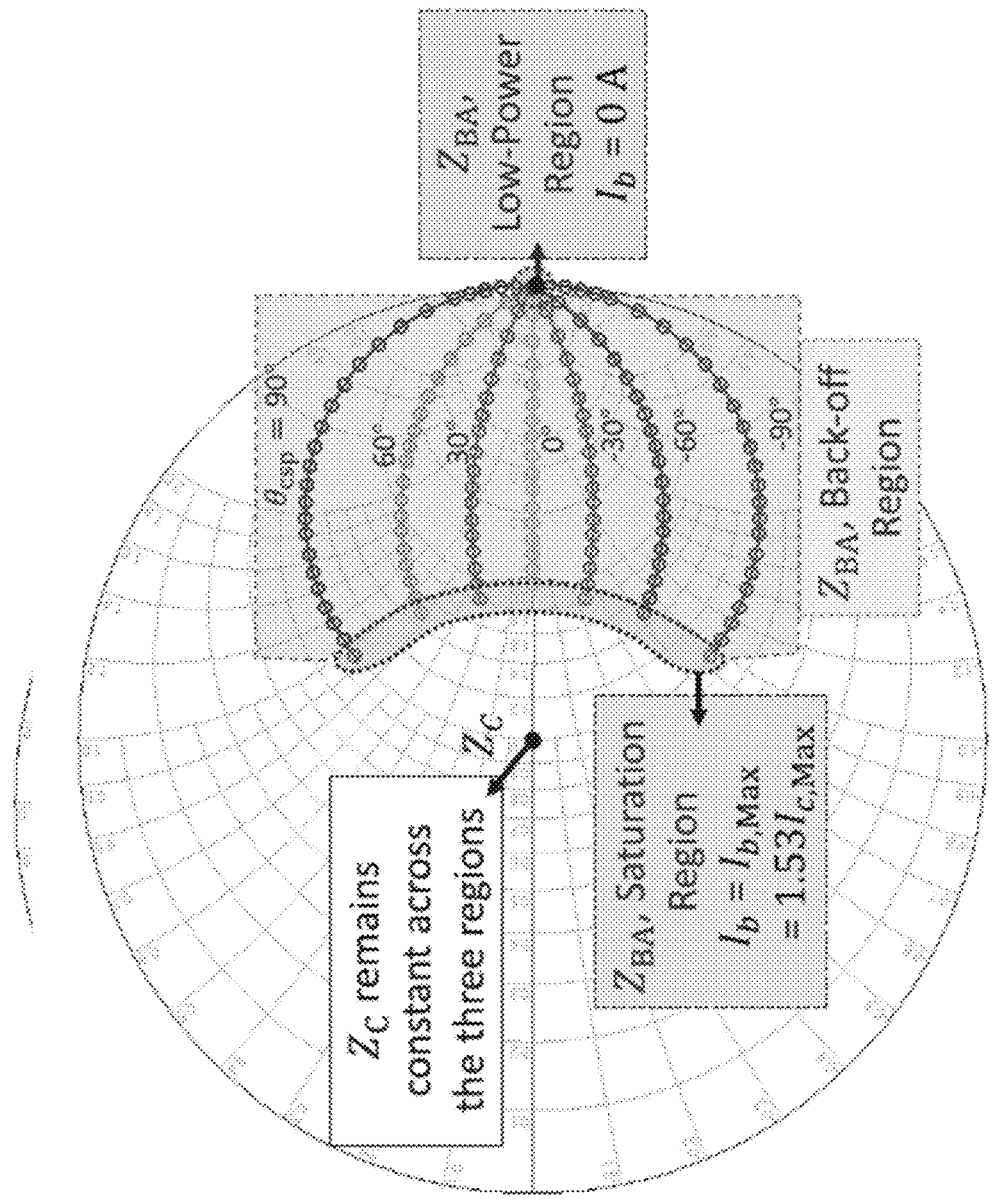
FIG. 6 illustrates dynamic BA (balanced amplifier) and CA (carrier amplifier) load impedances using the ideal generalized model (Output backoff (OBO)=10 dB) according to one implementation described herein.

As indicated by (3)-(10), the balanced amplifier can equivalent to the peaking amplifier in a Doherty PA topology, in terms of the boundary points (e.g. ∞, and $Z_0$) of the corresponding load-modulation trajectory. Meanwhile, the trajectory connecting these two boundary points can be determined by the phase of the CSP, i.e., $\theta=\theta_{csp}$, given the fixed $I_{c,Max}/I_{b,Max}$ ratio determined using (6) with a specific target OBO. In some implementations, the trajectory can be solely determined by the phase of the CSP. FIG. 6 shows the load trajectory of BA with a variation of $\theta_{csp}$ for OBO of 10 dB. Unlike the asymmetrical Doherty PAs, the load modulation of BA, as the peaking amplifier of PD-LMBA, can be maintained.

In some implementations of the present disclosure, this constantly resistive load trajectory is the optimal solution as explained by the classical Class-B loadline theory. Such a load-modulation behavior ideally ensures a maximized back-off efficiency of the PD-LMBA, which can be considered a major advantage over asymmetrical Doherty PA for extension of dynamic power range. In some implementations, there can be no requirement to dynamically change the phase of CA 106 as a function of power, which can be required in implementations of LMBAs. This characteristic can be highly desired for some implementations of RF-input LMBA designs, in which the dynamic phase control can difficult compared with the dual-input LMBA design.

In summary, the PD-LMBA architecture described in this example implementation of the present disclosure can include four advantages over other implementations of LMBAs and other load-modulation techniques:

(1) The power asymmetry between carrier and peaking amplifiers can be easily realized for achieving extended power back-off range since the BA with two PAs combined is naturally stronger in power generation than the single branch of CA 106.

(2) As the carrier amplifier, CA 106 is loaded with a constant impedance ideally not affected by the OFF-state impedances of BA1 118 and BA2 120, which significantly simplifies the complexity of broadband design without having to control the load trajectory of the carrier amplifier over a wide frequency range.

(3) The cooperation of BA and CA 106 in PD-LMBA ensures an optimized load-modulation trajectory of the BA, leading to the maximized efficiency over the entire extended power back-off range.

(4) At any given in-band frequency, the optimal load-modulation behavior can be achieved only by setting a static phase offset between BA and CA 106, thus minimizing the circuit and system complexity.

Example 2

Practical PD LMBA Design for Optimized Efficiency Over-extended Power Back-Off Range The PD-LMBA simulation presented in the previous example includes ideal circuit components where the transistors are modeled as ideal current sources. In this example, implementations of the present disclosure are considered for implementation using the characteristics of realistic components (e.g., parasitics of transistors). Implementations of the present disclosure can include PD-LMBA circuits using realistic circuit components and provide increased efficiency over an extended dynamic power range. In the present example, a range of 10 dB was considered.

Figure 7:
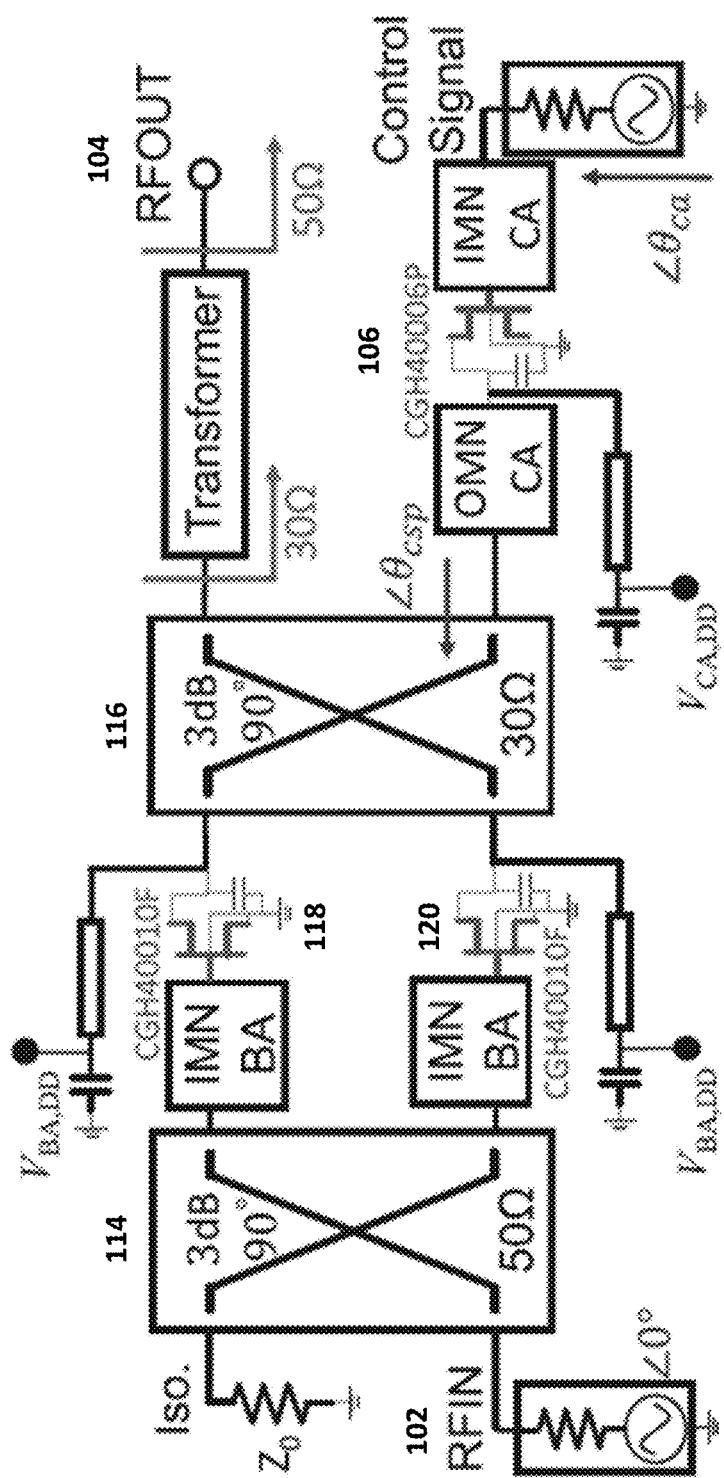
FIG. 7 illustrates a simulation setup of the PD-LMBA described herein including realistic models of GaN transistors according to one implementation described herein.

Following the PD-LMBA theory and ideal schematic (see FIGS. 5A-5B), a practical circuit of an implementation of a PD-LMBA can be established using realistic GaN transistors, as the schematically shown in FIG. 7. FIG. 7 illustrates a PD-LMBA including a RF input and RF output ports 102 and 104. The quadrature couplers 114 and 116 are also illustrated. Schematics for the balanced amplifiers of the peaking amplifier circuit 118 and 120 are also illustrated, along with the carrier amplifier circuit 106. The peaking and carrier amplifier circuits include labels with the names of the transistors used (the CGH40010F and CGH4000P), but it should be understood that the transistors named are only intended as examples. Similarly, the impedances shown for balanced amplifiers 114 and 116, as well as the impedances shown for the RF output 104 are also intended only as non-limiting examples.

The BA matching can be realized through a combination of non-50-ohm. quadrature coupler and bias line. This direct connection of transistor and coupler can simplify the load-modulation control of the realistic BAs without being affected by excessive output matching networks. To better explain the PD-LMBA design in terms of amplitude control and phase control, the design starts with separated inputs of BA and CA 106, while these two independent sources will be replaced by a unified RF-input together with a power divider in the actual prototype development.

Amplitude Control for Extended Power Back-Off Range

Based on the PD-LMBA operation described in Example 1, the amplitude control can include of two parts: 1) determination of current/power scaling ratio between BA and CA 106 and 2) saturation of CA 106 (in Class-AB) and turn-on of BA (in Class-C) simultaneously at the target power back-off.

The maximum saturated power of CA 106 is determined by the target OBO range and the overall maximum output power:

$$P_{CA,SAT} = \frac{P_{Total,SAT}}{OBO} \quad (7)$$

where $P_{Total,SAT}$ denotes the total maximum power generated by the entire LMBA, which combines the saturation power from BA and CA $$P_{Total,SAT} = P_{BA,SAT} + P_{CA,SAT}. \quad (8)$$

In this practical design with GaN transistors, the actual $P_{CA,SAT}$ can be realized through proper selection of CA 106 device size (6-W GaN transistor, Wolfspeed CGH40006P) and reduced drain bias voltage for an extended OBO range of 10 dB. The maximum power of BA can be determined as $$P_{BA,SAT} = (OBO-1)P_{CA,SAT} \# \quad (9)$$

With a large target OBO, a high BA power can be achieved by using large-sized devices together with full drain bias voltage and by combining the power of BA1 118 and BA2 120. In implementations of the present disclosure, a "large-sized device" can refer to devices such as a 10-W GaN transistor, for example a CGH40010F 10-W GaN transistor sold under the trademark Wolfspeed.

Figure 8:
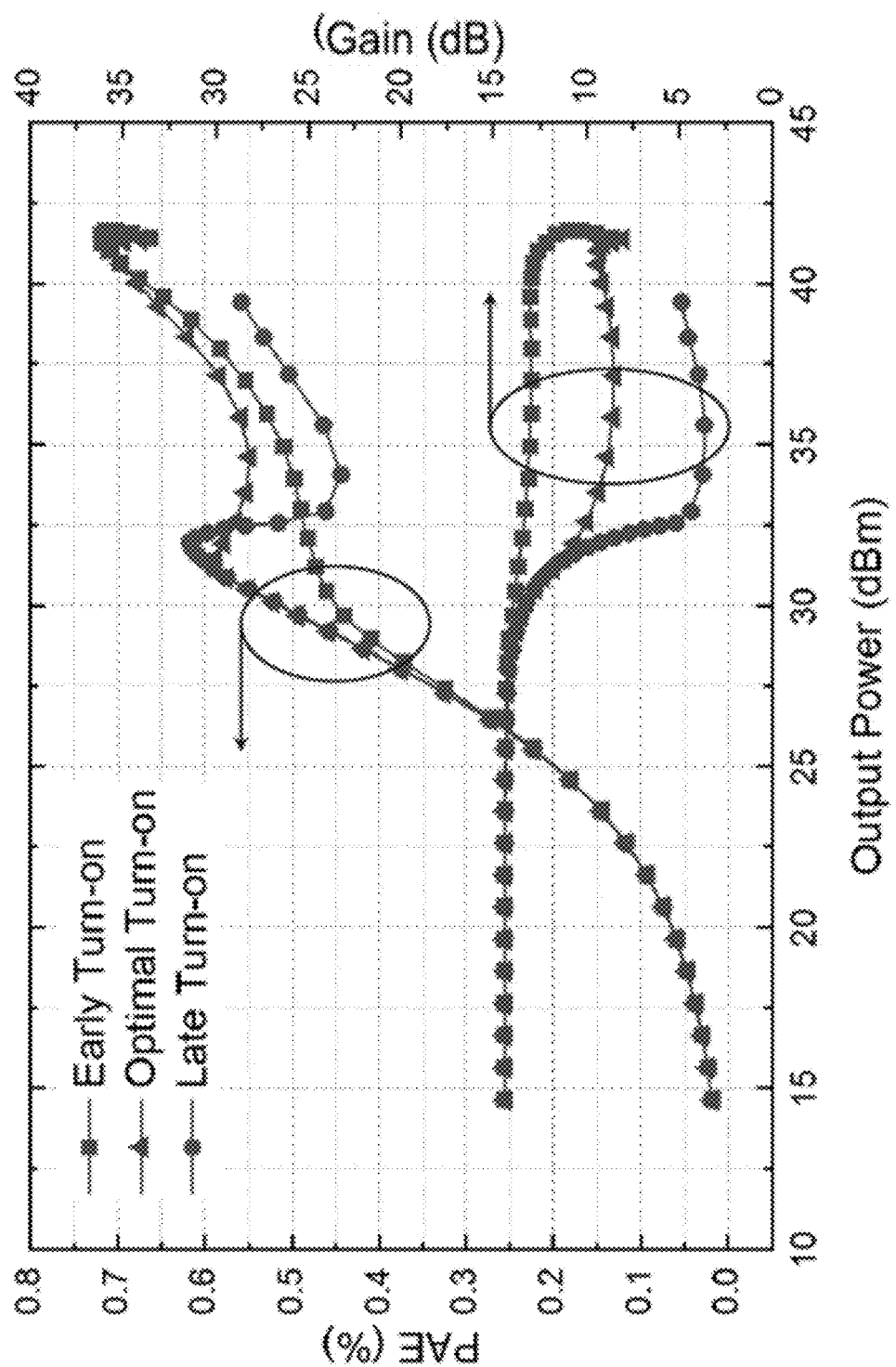
FIG. 8 illustrates simulation results of power-added efficiency (PAE) and gain vs. output power at 2.3 GHz under different $V_{BA,GS}$ bias settings according to one implementation described herein.

In some implementations of the present disclosure, for the two variables governing the turn-on of BA (i.e., BA gate bias voltage and the input power dividing ratio) the effect of $V_{GS,BA}$ can play a dominant role. By setting the power dividing ratio between BA and CA 106 to 1:1, the turn-on point of BA can be controlled partially or solely through choosing the depth of Class-C bias. FIG. 8 illustrates the effect of BA turn-on point on the LMBA's efficiency versus power behavior. In some implementations the highest power-added efficiency (PAE) over the entire power back-off range can be achieved through an optimal turn-on setting of BA.

Phase Control for Maximized Back-Off Efficiency

Figure 9:
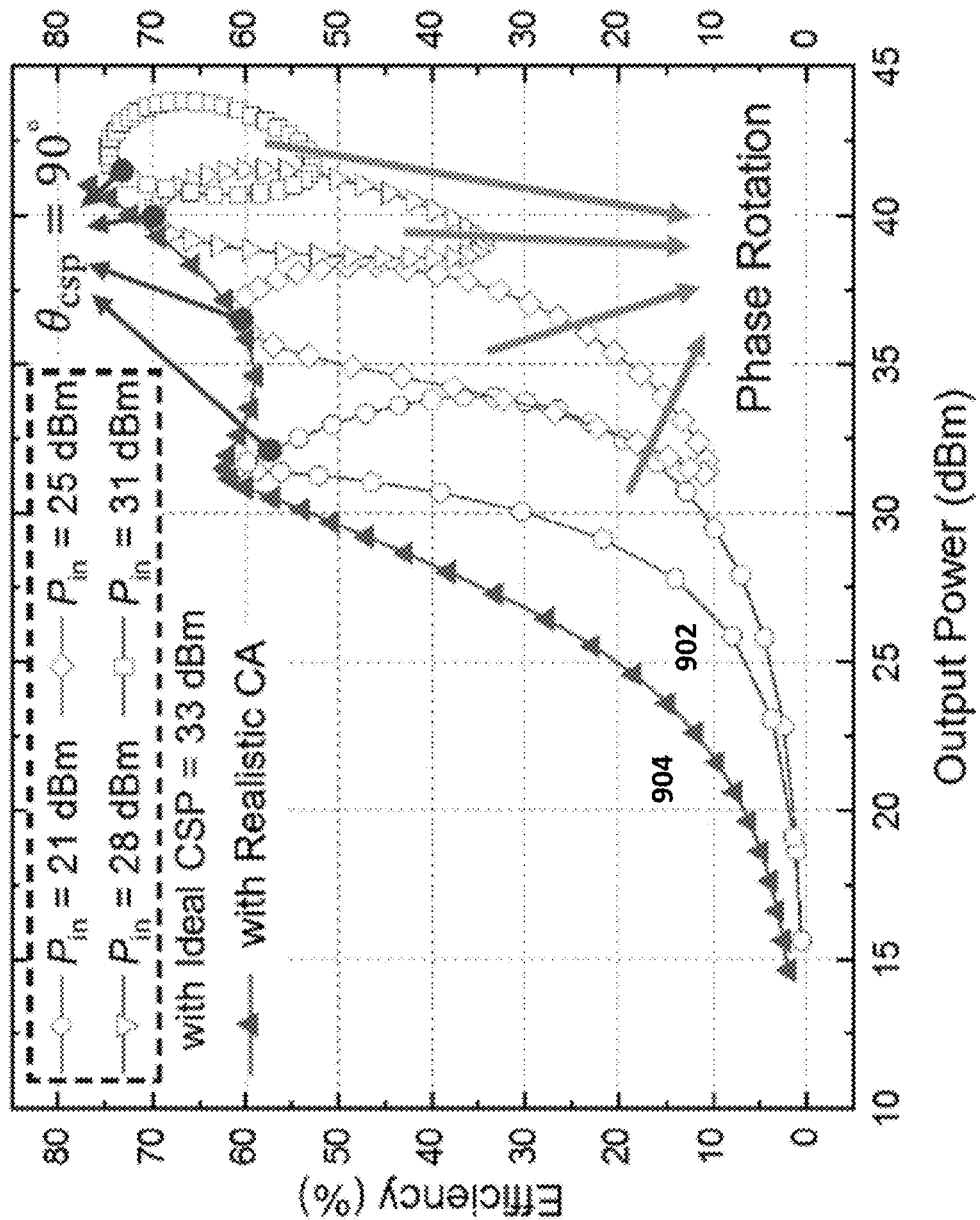
FIG. 9 illustrates a plot of efficiency vs. output power based on the simulated large-signal performance at 2.3 GHz for an implementation of the present disclosure. Ideal CSP (=33 dBm) with various phase settings is illustrated, as compared to optimized CA ($\theta_{ca}$=−10). The optimal phase offset can be determined using FIG. 9 for the implementation of the present disclosure.

As discussed in Example 1 and shown in FIG. 6, there can be one or more optimal phase settings of CA 106 that can lead to the optimal load-modulation trajectory and maximized efficiency. With the on-chip and package parasitics of realistic transistors, the optimal load trajectory of GaN devices in BA at the package plane can deviate from the ideal purely resistive load trajectory. Thus, a non-0° of control phase can be utilized to compensate for this effect. In order to find the optimal control phase, an ideal phase-swept RF source with constant CSP (=33 dBm) can fed into the isolation port by replacing the actual CA 106. Assuming 70% of CSP efficiency, the overall LMBA efficiency can extracted with different BA input powers under 2 W of CSP through 360° phase rotation (10' of step size), as shown by the red curve 902 in FIG. 9. In some implementations of the present disclosure, the highest efficiency points over the entire power back-off range can correspond to a nearly constant control phase of $\theta_{csp}=90$ efficiency-optimal phase. Such an efficiency optimization with only static phase offset is not only applicable to the particular circuitry in FIG. 7, but it can also be expanded to all possible PD-LMBA circuit topologies.

With the realistic GaN-based CA 106 connecting to the isolation port of the output quadrature coupler, the interface plane of phase control is moved from the isolation port to the input of CA 106, as shown in FIG. 7. By sweeping the input signal phase of CA 106, an optimal phase of $\theta_{ca}=-10°$ is obtained, which leads to maximized overall LMBA efficiency along the entire OBO range, as shown by the green curve 904 in FIG. 9. The efficiency performance PD-LMBA design with realistic CA 106 well matches the maximum efficiency achieved with ideal CSP.

Figure 10:
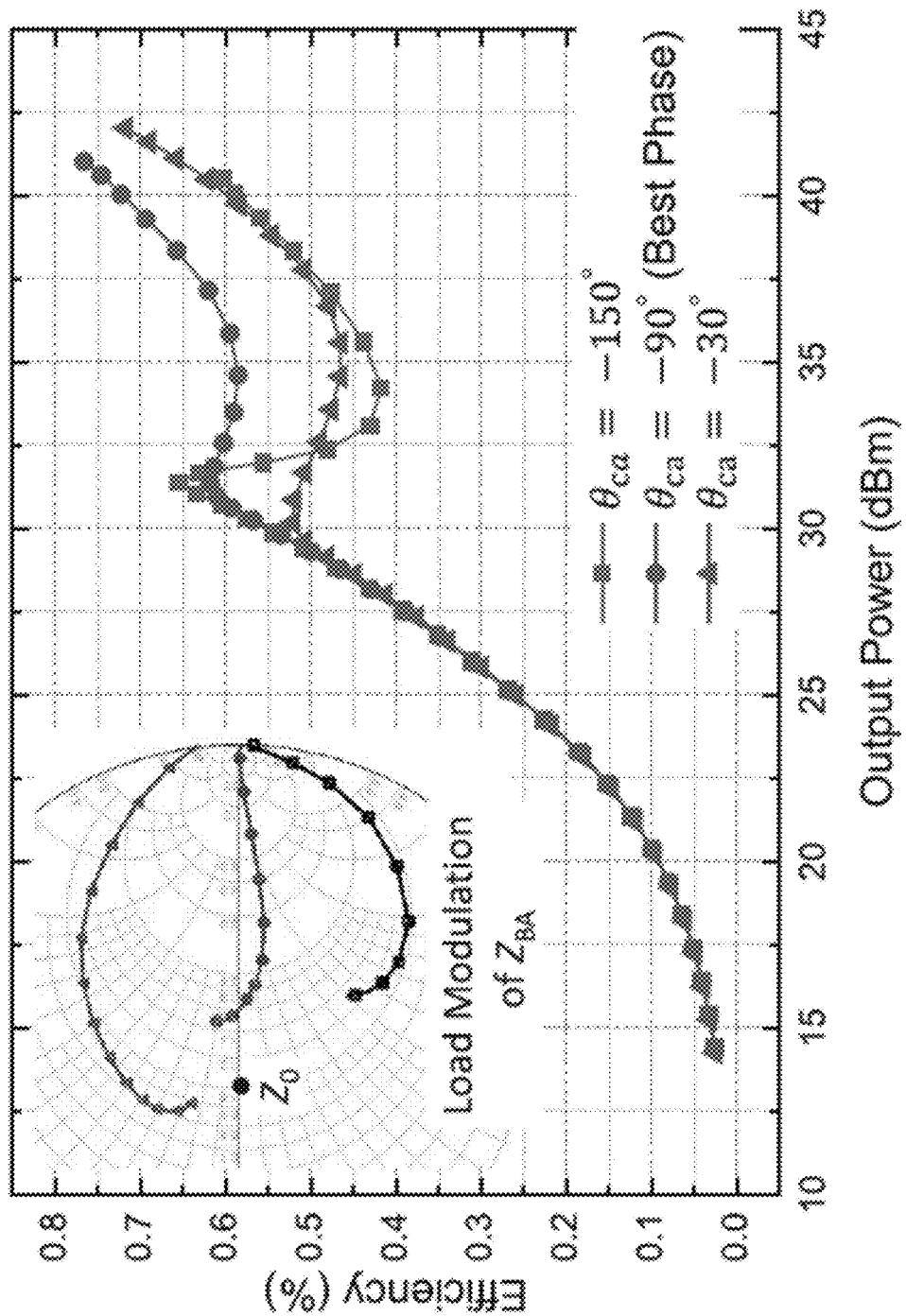
FIG. 10 illustrates a simulated efficiency profile at 2.3 GHZ under different $\theta_{ca}$ settings according to one implementation described herein.

To fully verify the theory, the transistor parasitic network of BA is modeled and deembedded to access the intrinsic drain load-modulation trajectory at the current generator plane, as shown in the inset Smith chart of FIG. 10. The intrinsic BA loadline tracks the resistive path from $P_{Max}$ to 10-dB OBO, which well validates the theory. As the power level further decreases below 10-dB back-off, the BAs turns off and $Z_{BA}$ approaches to the high-impedance region at the edge of Smith chart (see FIG. 10), while the power is primarily generated by CA 106 only at this range.

Example 3

Wideband RF-Input and PD-LMBA Design

In some implementations of the present disclosure the operations of BA and CA 106 in the PD-LMBA are nearly independent because the CA's load impedance constantly remains $Z_0$ and the BA's load modulation is mainly due to the variation of its own current ($I_{c,Max}/I_b$ term in (4)). This can be seen in implementations described with reference to the simulations and designs disclosed in Examples 1 and 2. Given the fact that the individual BA and CA 106 can both be expanded to wideband designs, the PD-LMBA exhibits promising wideband potential. In some implementations, a challenge for wideband PD-LMBA design shifts to the wideband phase control of CA 106 to result in optimal load-modulation behavior of BA. Following the circuit schematic shown in FIG. 7, the wideband RF-input PD-LMBA design can be performed by broadening the bandwidth of all the building blocks and by unifying the inputs of BA and CA 106 to a single input with proper phase offset. In an example implementation, the target bandwidth is from 1.5 to 2.7 GHZ covering a majority of cellular communications bands.

Wideband BA Design

The balanced amplifier comprises two identical PAs coupled in 90° out-of-phase through input and output quadrature couplers. The input coupler can be built using a commercial device with a wide operational bandwidth from 1 to 3 GHz. The output coupler can be implemented using a three-section branch-line hybrid structure, which offers sufficient bandwidth covering the design target and is code-signed with the PAs. The two balanced PAs are implemented with 10-W GaN transistors, for example a CGH40010F 10-W GaN transistor sold under the trademark Wolfspeed.

The PA output matching can be performed using the non-50-ohm output coupler together with the bias line. From the load-pull simulation, the optimal load admittance ($Y_L=G_L+j\ B_L$) of the GaN transistor presents a nearly constant real part over the target frequency range, while the imaginary part increases (becoming less inductive) with frequency. Such a frequency response of the optimal loadline can be due to the parastics of the packaged GaN transistor. Therefore, the characteristic impedance of the branch-line hybrid coupler, $Z_1$, can be selected to provide the constant conductance ($G_L=1/Z_1$) over the target bandwidth, and the bias line as a shunt inductor can be utilized to provide the susceptance with the desired frequency response (j $B_L=-j/(\omega L)$). In some implementations, the BA's impedance in PD-LMBA at $P_{BA,SAT}$ can be different from the ideal BA with the contribution of CA 106, as indicated by (10). Therefore, the finalized value of $Z_1$ (=30Ω) and the bias-line length can be determined through cosimulation with CA 106. A wideband 3:5 transformer follows a branch-line hybrid coupler to match the impedance to the 50-ohm terminal.

The input matching is designed and implemented using a multistage low-pass network based on TLs to cover the target bandwidth from 1.5 to 2.7 GHZ. The design of such a matching circuit follows the well-established methodology presented in. This article uses a four-section TL-based low-pass networks to realize the input matching, with each stage consisting of a series L (high-impedance TL) and shunt C (low-impedance open-ended stubs). The final lengths and widths of the TLs can be tuned in order to absorb the parasitics of the RF and dc block as well as the device packaging.

Wideband CA Design

According to the amplitude control scheme described in implementations of examples 1 and 2 herein, the saturated power of CA 106 can determine the dynamic range once the BA power is fixed. To achieve the target OBO of 10 dB, $P_{CA,SAT}$ should be around 9.5 dB below $P_{BA,SAT}$. To realize this low output power, the CA 106 can implemented with a 6-W GaN transistor, and it is biased in the Class-AB mode with partial $V_{DD}$. A non-limiting example of a 6-W GaN transistor that can be used is the CGH40006P 6-W GaN transistor sold under the trademark Wolfspeed. As the CA's maximum efficiency at $P_{CA,SAT}$ determines the overall LMBA efficiency at the target OBO point, the design of CA 106 as a single PA can be aimed at achieving the highest possible efficiency. The output matching network design can be performed to offer optimal loading impedance at both fundamental frequency and harmonics over the target bandwidth. Since the CA 106 is directly connected to the non-50-Ohm coupler, the design of output matching is based on the coupler characteristic impedance, $Z_1$.

For the input matching network design, the same methodology can be applied in some implementations of the present disclosure to the BA's input design, and a three-section low-pass network based on TLs can be designed to provide wideband input matching for the GaN transistor.

Wideband BA-CA Phase Offset Design

Figure 11:
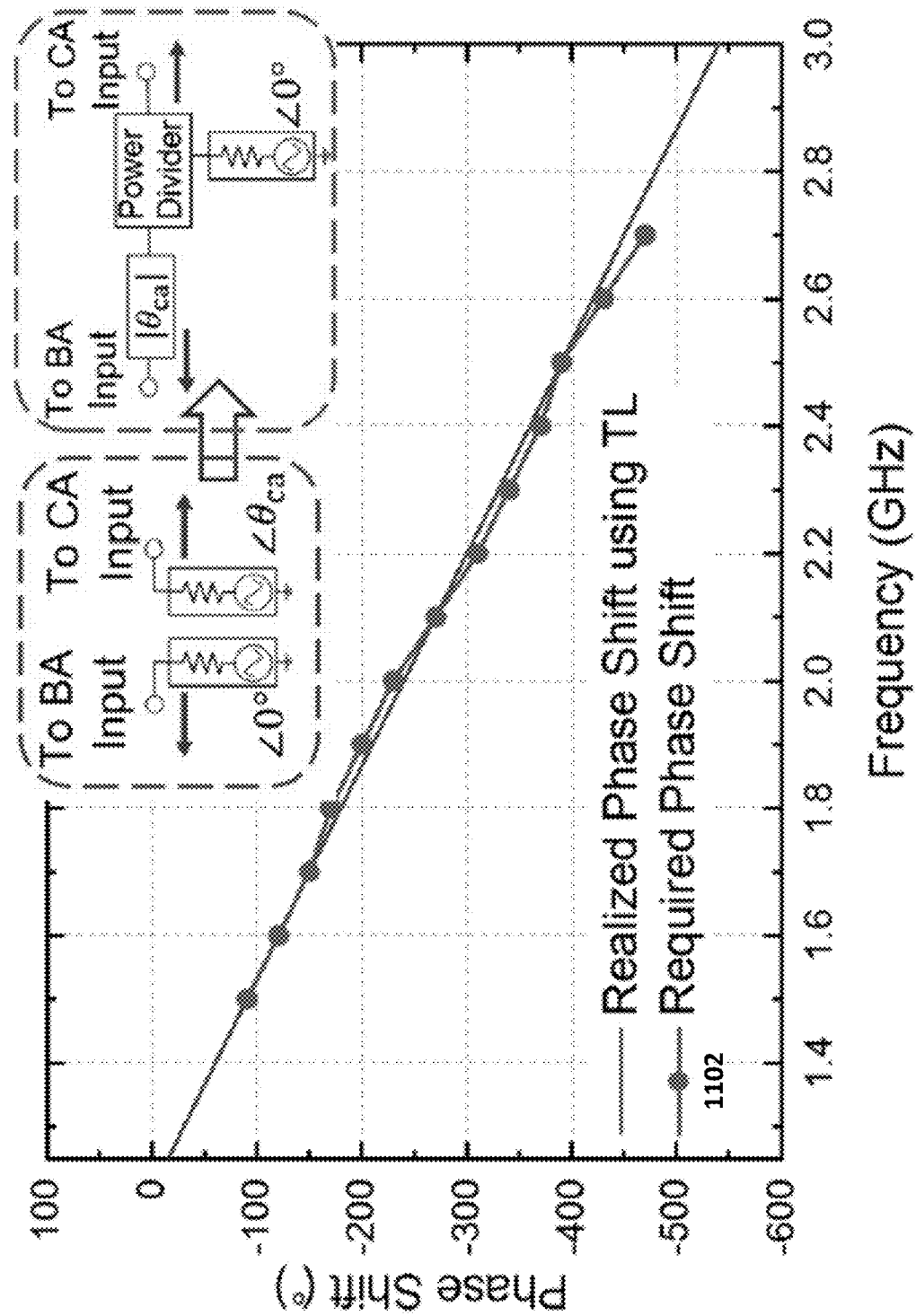
FIG. 11 illustrates simulation results for an implementation of the present disclosure. The simulated optimal BA-CA phase offset at different frequencies are illustrated on a plot of phase shift vs. frequency. Additionally, a schematic illustrating the design of a TL-based wideband phase shifter for merging the BA and CA inputs is also illustrated.

In some implementations of the present disclosure, the completion of wideband BA and CA 106 designs, the load modulation of BA can be primarily governed by the relative phase between BA and CA 106. At a particular frequency, there is an optimal BA-CA phase offset that leads to the maximized back-off efficiency, as shown in FIG. 10. Using the dual-input (with equal amplitude) schematic in FIG. 7, an optimal phase offset can be determined for each frequency point along the target bandwidth (0.1-GHz step), which is presented as the dots 1102 in FIG. 11. An optimal phase offset can be almost linearly proportional to frequency with a negative slope. This frequency behavior can be implemented using a 50-ohm TL in connection with an in-phase input source, realizing a wideband phase shifter and offering accurate wideband phase control. In implementations with a negative value of the relative phase between CA 106 and BA, this offset TL in the CA 106 path can have a negative length, which can be physically implemented by placing a symmetrical TL with positive length in the BA path. With such a TL phase shifter, the dual inputs can be replaced by a single input with a standard wideband Wilkinson divider.

In some implementations of the present disclosure including RF-input wideband LMBA designs, LC-based bandpass filter can be utilized to implement the BA-CA phase shifter for wideband phase control. However, the frequency response of the phase can be sensitive to the value of LC components. In some implementations, manufacturing variation can be compensated for using a phase shifter (e.g. the TL-based phase shifter described with reference to some implementations described herein). This phase shifter can reduce the effects of manufacturing variation and reduce the complexity for implementation, and compensate for differences between the simulated performance and the performance of the manufactured components. Furthermore, these benefits can improve the yield in mass production.

In some implementations of the present disclosure, the input power of the CA 106 can continue to increase after reaching saturation at 10-dB OBO due to the RF-input 102, resulting in overdriving of the CA 106. It should be understood that the PD-LMBA described in the Examples was designed mainly to maximize efficiency. The linearity is concerned as CA 106 is overdriven, and the overdriving of the main amplifier can be utilized in other load-modulation architecture, a non-limiting example of which is the distributed efficient power amplifier (DEPA). However in some implementations described herein, the overdriving of the main amplifier does not affect digital linearization performance.

Overall Schematic and Simulation Results

Figure 12:
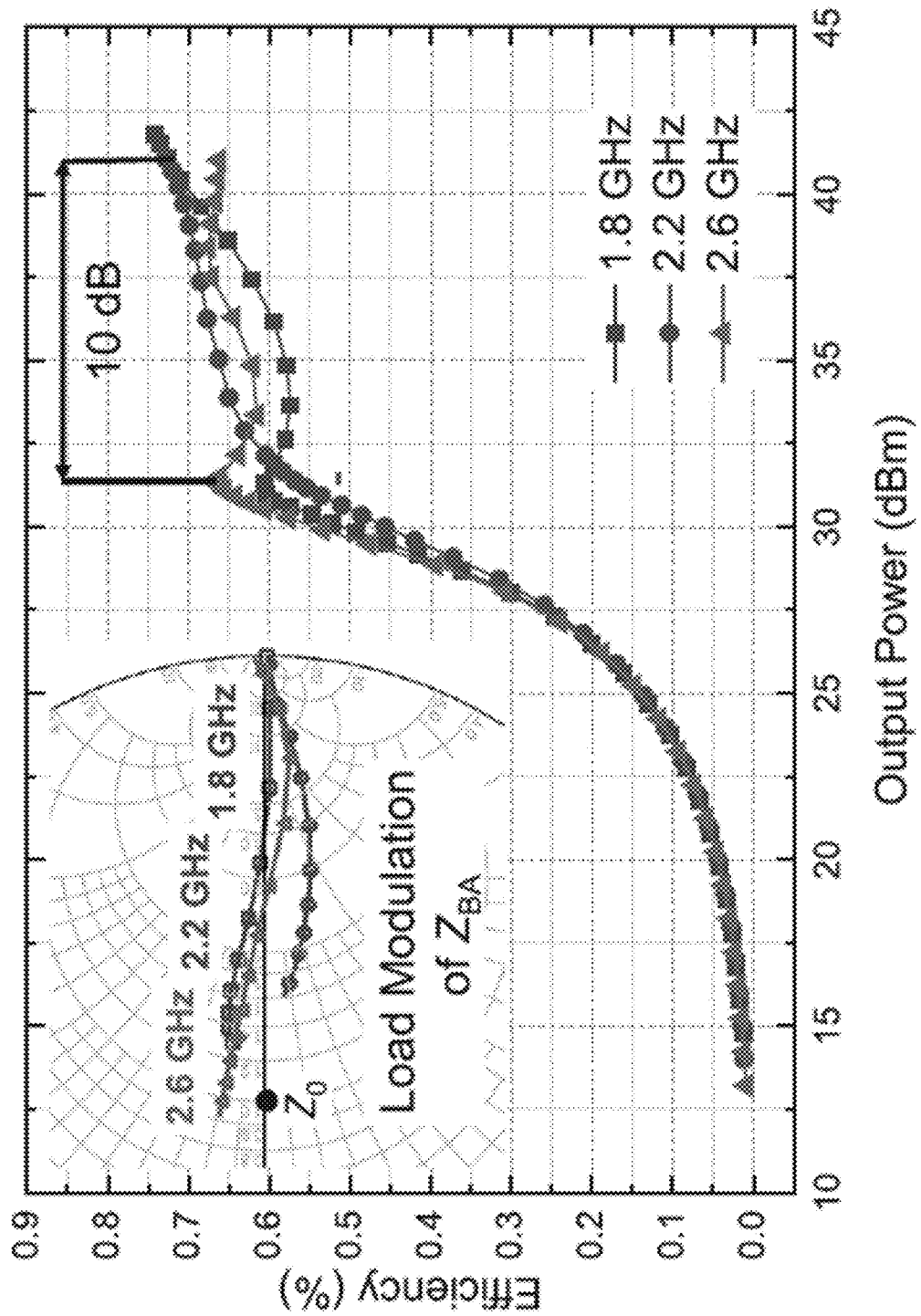
FIG. 12 illustrates power-swept continuous wave (CW) simulation results of the PD-LMBA for the best phase tuning settings at different frequencies according to one implementation described herein.
Figure 13:
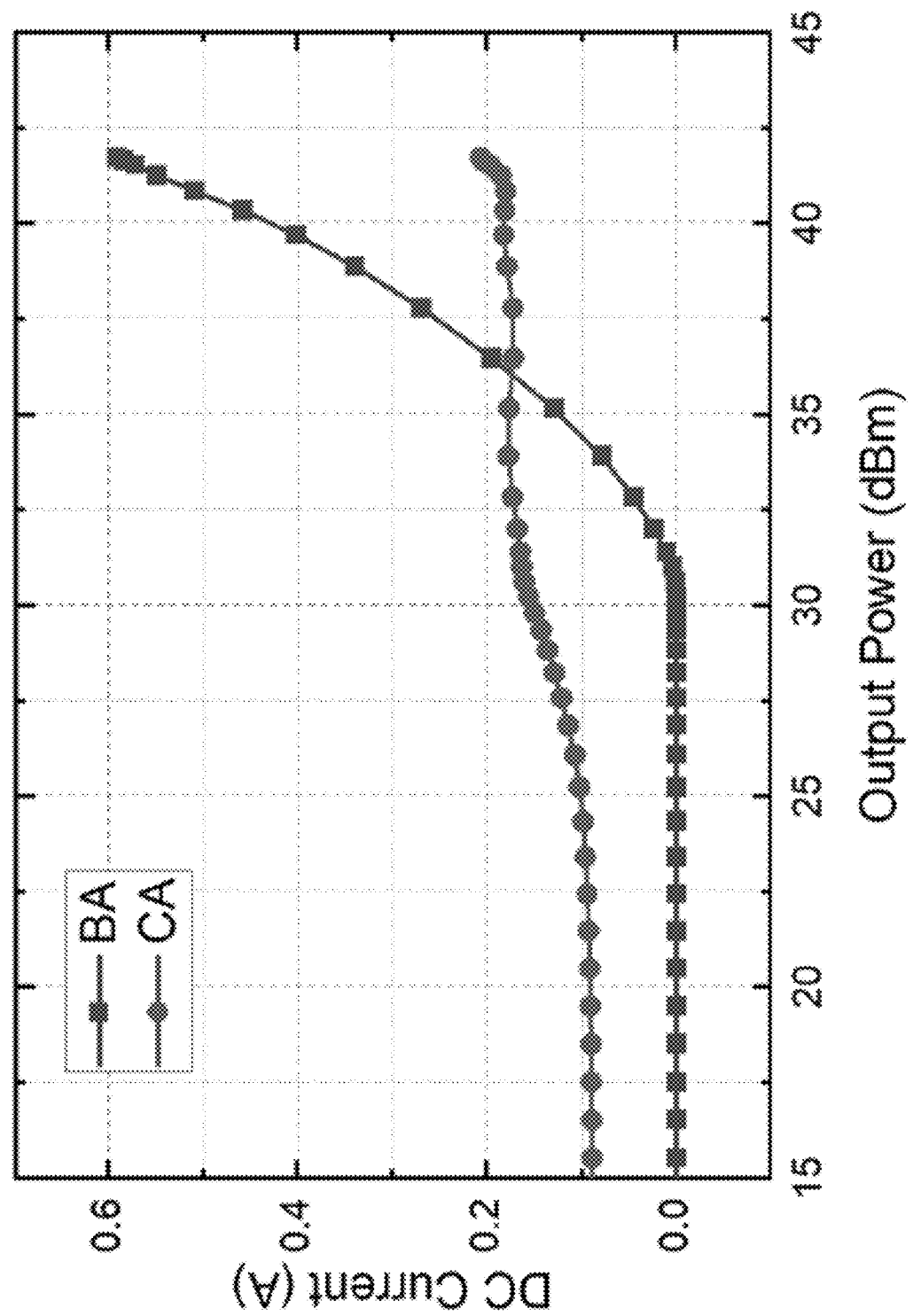
FIG. 13 illustrates simulated drain dc current vs. output power of BA (two Bas in total) and CA at 2.3 GHz according to one implementation described herein.

Through amplitude and phase control described in in this example, the extended power back-off range and the optimal load-modulation trajectory can be achieved at different frequencies, as shown in FIG. 12. When the power falls below the target OBO, the output impedance of the BA transistor ($Z_{BA}$) can be close to the high-impedance region on the Smith chart edge. This means that the BA starts to turn off, while the power is purely generated by the CA 106. This Doherty-like behavior can be achieved by properly setting the gate bias voltages of BA and CA 106 below and above the transistor threshold, respectively. The DC current of BA and CA 106 is extracted from the continuous-wave (CW) simulation to verify this PD-LMBA operation, as shown in FIG. 13. The turn-on point of BA is around 10-dB power back-off, where the CA 106 approaches its saturation. As the power increases beyond 10-dB OBO, a strong peaking effect of BA current is observed in parallel with an almost stable CA 106 current. Compared with the standard DPA's 6-dB load-modulation range, the PD-LMBA achieves more than doubled OBO range covering a wide frequency range.

Figure 14:
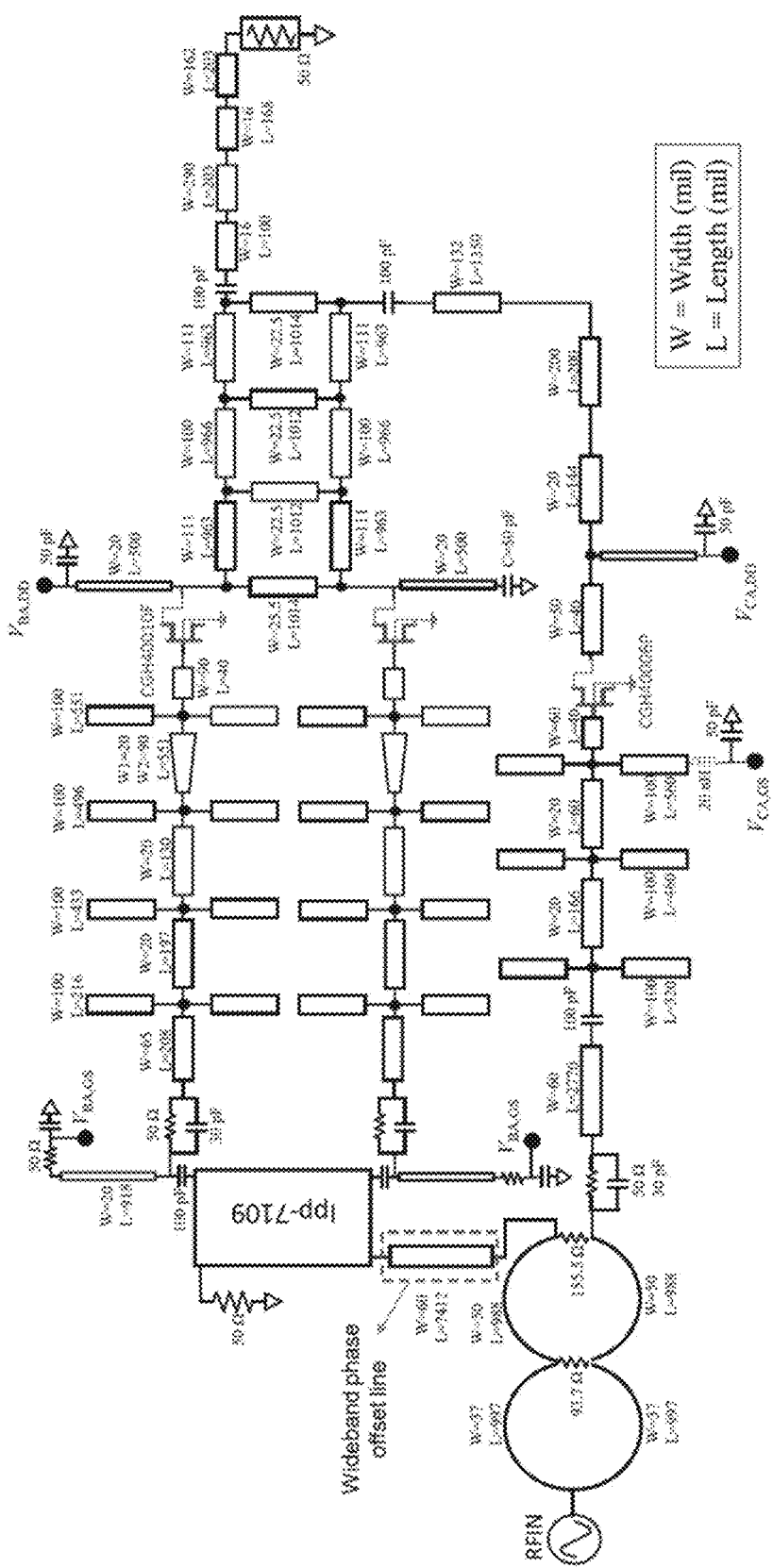
FIG. 14 illustrates a schematic of a PD-LMBA according to one implementation described herein.

In some implementations, upon finishing the design of individual building blocks including BA, CA 106, and phase shifter, the integrated PD-LMBA circuit can built and a non-limiting example of a finalized circuit schematic overview is shown in FIG. 14. The design values of the circuit elements are exhibited alongside the schematic. The input power splitter can be implemented using the two-stage Wilkinson divider for covering the target bandwidth. A wideband phase-offset TL is placed at the input port of BA. Moreover, stabilizing circuits including a parallel combo of capacitor and resistor can be placed at the input of each individual amplifier. For this PD-LMBA architecture, the overall bandwidth is governed by the bandwidth of output coupler. In this design, the coupler can be built with a multi-section branch-line structure on a single-layer printed circuit board (PCB). In some implementations, this coupler structure can further increase the bandwidth, but a larger bandwidth can be achieved in some implementations through advanced coupler designs based on multilayer PCBs. Other than the input coupler, the other individual building blocks, e.g., BA, CA, and output coupler, are not overdesigned in terms of bandwidth in the example implementation shown in FIG. 14. The phase-offset line can be added after optimizing the overall PD-LMBA using the dual-input model shown in FIG. 7. Implementations of the present disclosure can optimize the phase offset line of the PD-LMBA within the target band-width. Additionally, in some implementations, the optimization can include not overdesigning some or all of the individual building blocks or components of the PD-LMBA. Alternatively, the present disclosure contemplates that some or all of the individual building blocks or components may be overdesigned to use common or commercially available parts. Therefore overdesigning certain components can reduce the size and/or cost of those components in some circumstances.

Example 4

Example Implementation and Experimental Results

Figure 15:
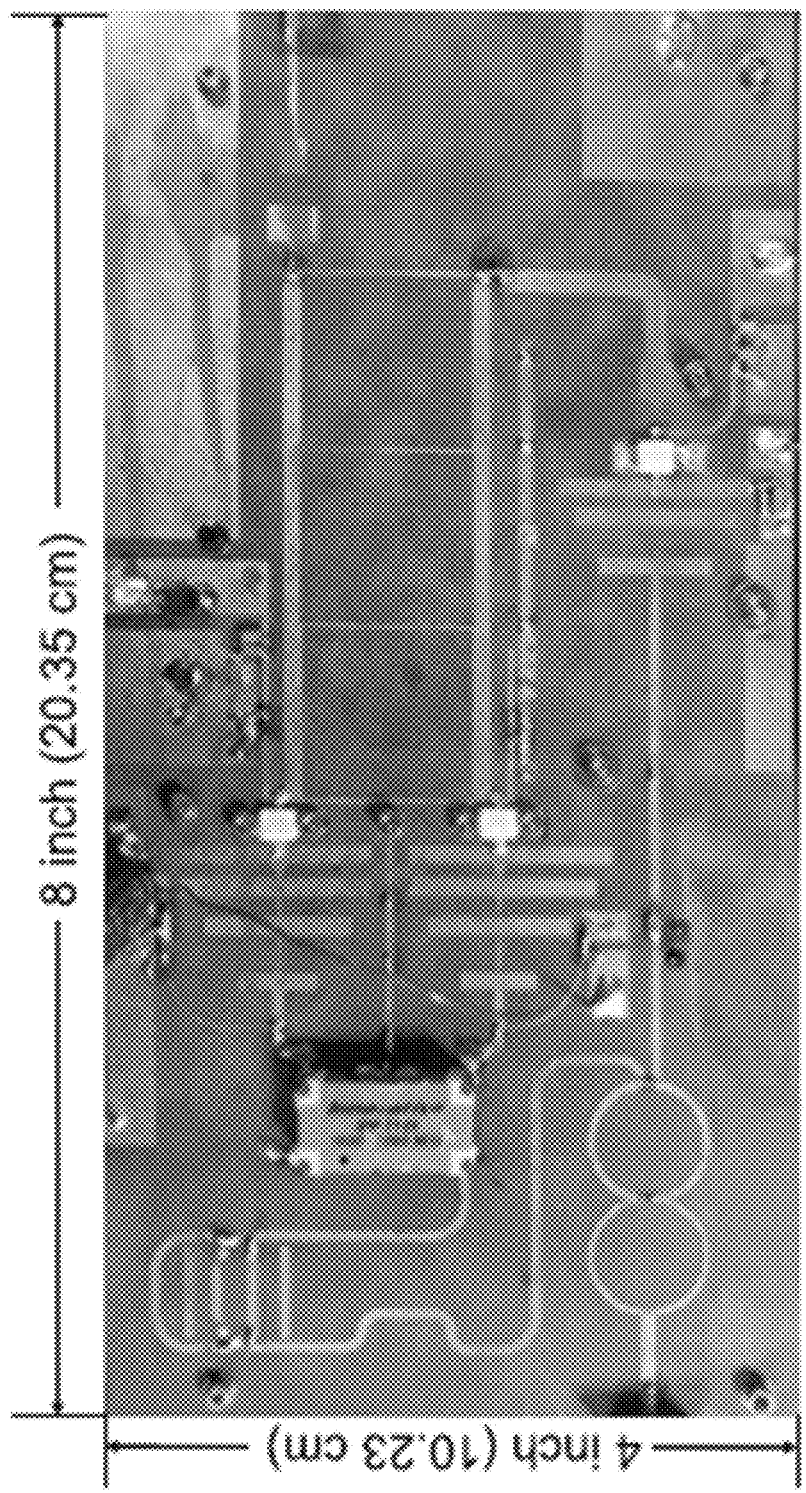
FIG. 15 illustrates a printed circuit board including a PD-LMBA according to one implementation described herein.
Figure 16:
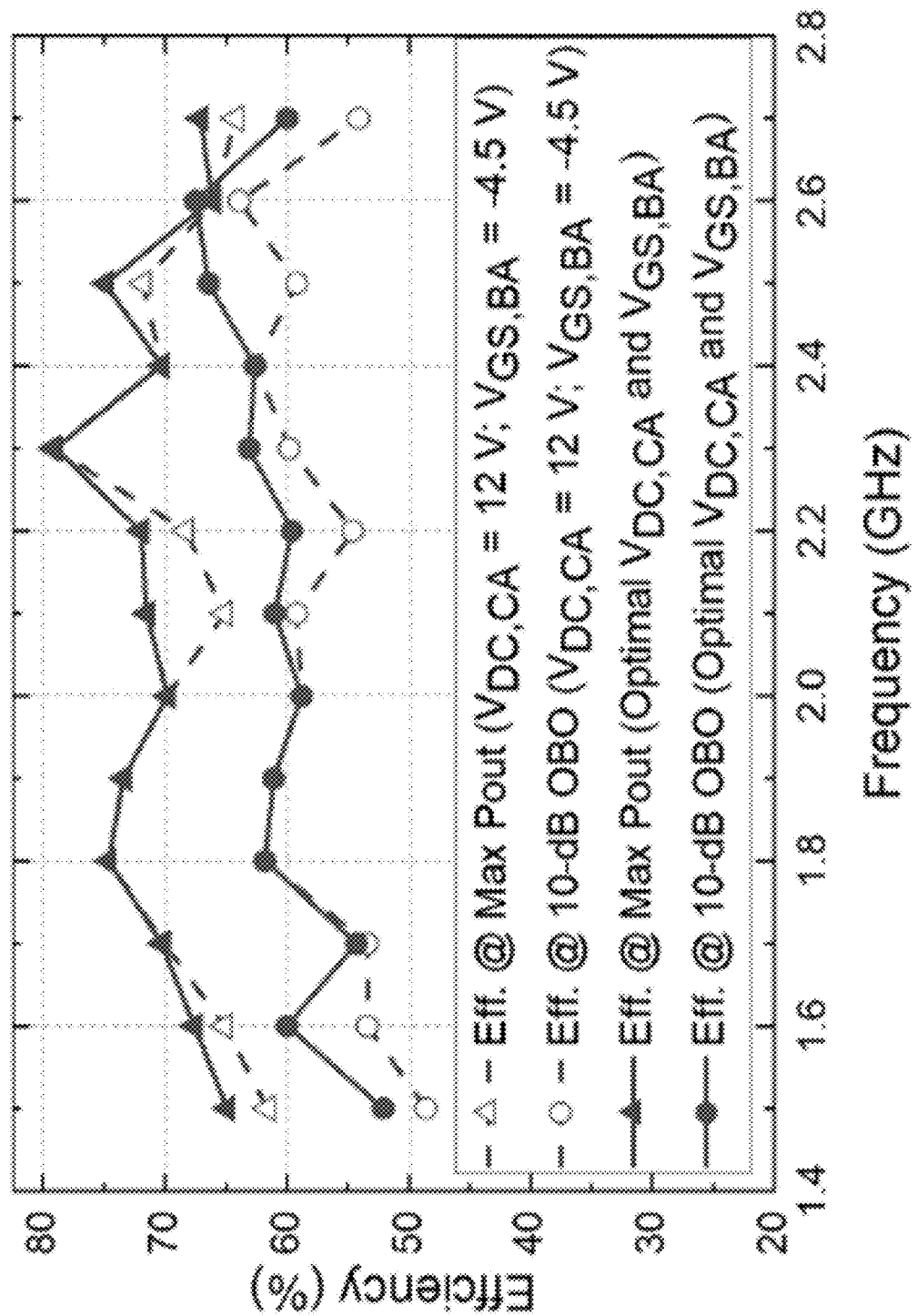
FIG. 16 illustrates a simulated power efficiency comparison between consistent $V_{GS,BA}$, $V_{DS,CA}$ and optimal $V_{GS,BA}$ (−5 to −4 V) and $V_{DS,CA}$ (10-14 V) at $P_{max}$ and 10-dB OBO levels from 1.5 to 2.7 GHZ according to one implementation described herein.

In another example implementation of the present disclosure, a designed broadband PD-LMBA prototype was fabricated on a 20-mil-thick Rogers Duroid-5880 PCB board with a dielectric constant of 2.2 and is mounted on a copper substrate for handling and measurement, as shown in FIG. 15. The PCB footprint size was 4 in×8 in. The prototype was experimentally evaluated with both CW and modulated stimulation signals. In the measurement, the BA is biased in Class-C with 28 V of $V_{DS,BA}$. The gate bias voltage $V_{GS,BA}$ is set between −5 and −4 V to obtain the best PAE in the test, which varies with different frequencies, as shown in FIG. 16. The CA is biased in Class-AB with of $V_{GS,CA}$ around 2.8 V and $V_{DS,CA}$ around 12 V (tuning range from 10 to 14 V ensuring CA saturation at 10-dB OBO). Due to the reduced CA bias voltage and the high-breakdown voltage of GaN transistor, the overdriving of CA does not affect the circuit reliability in this implementation. This example implementation of a PD-LMBA was capable of sustained/prolonged high-power operation. The present disclosure also contemplates that in implementations where the PD-LMBA can be implemented on-chip, an overdriving effect can be mitigated through analog control.

Continuous-Wave Measurement

Figure 17:
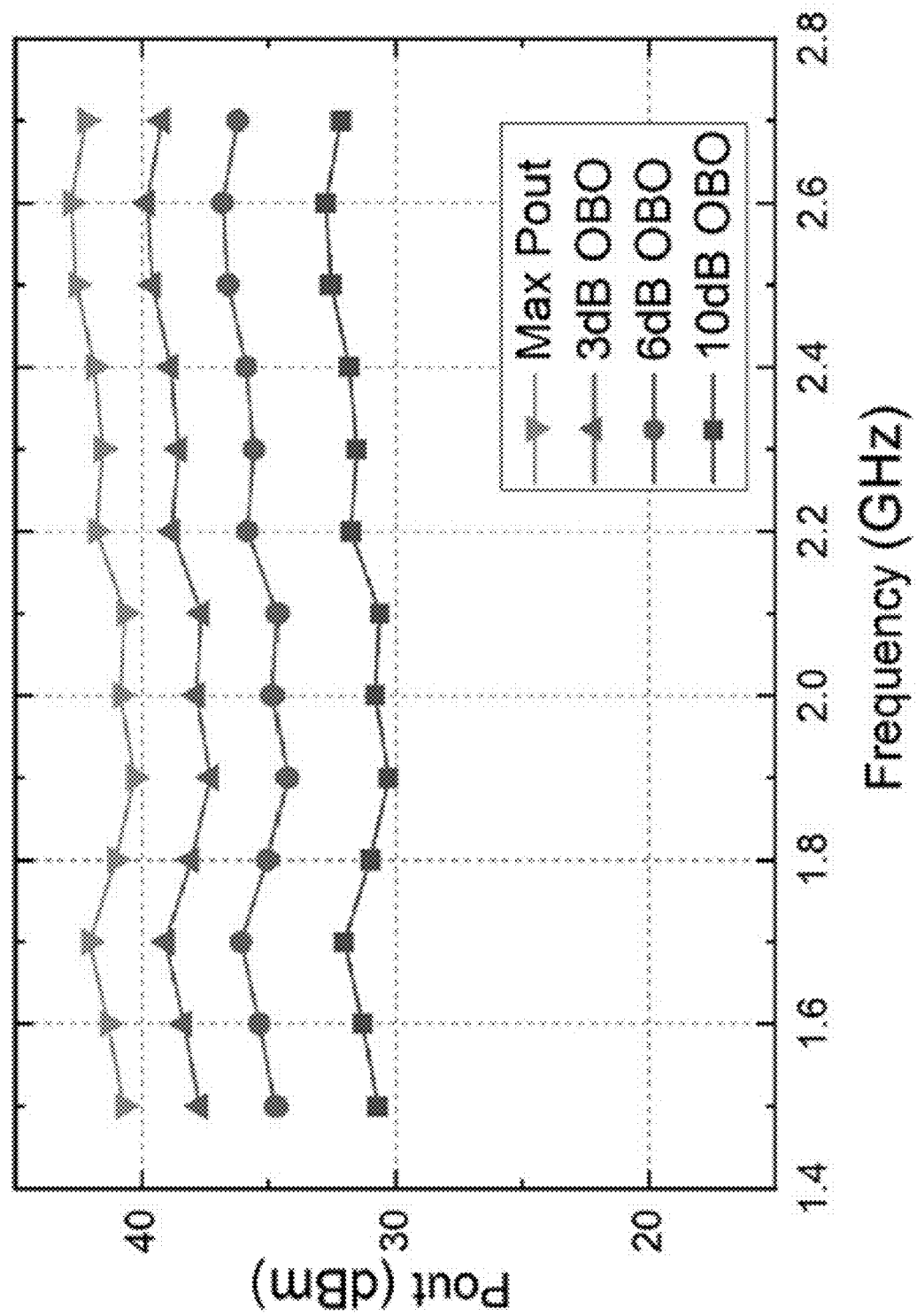
FIG. 17 illustrates the measured output power at various OBO levels from 1.5 to 2.7 GHz according to one implementation described herein.
Figure 18:
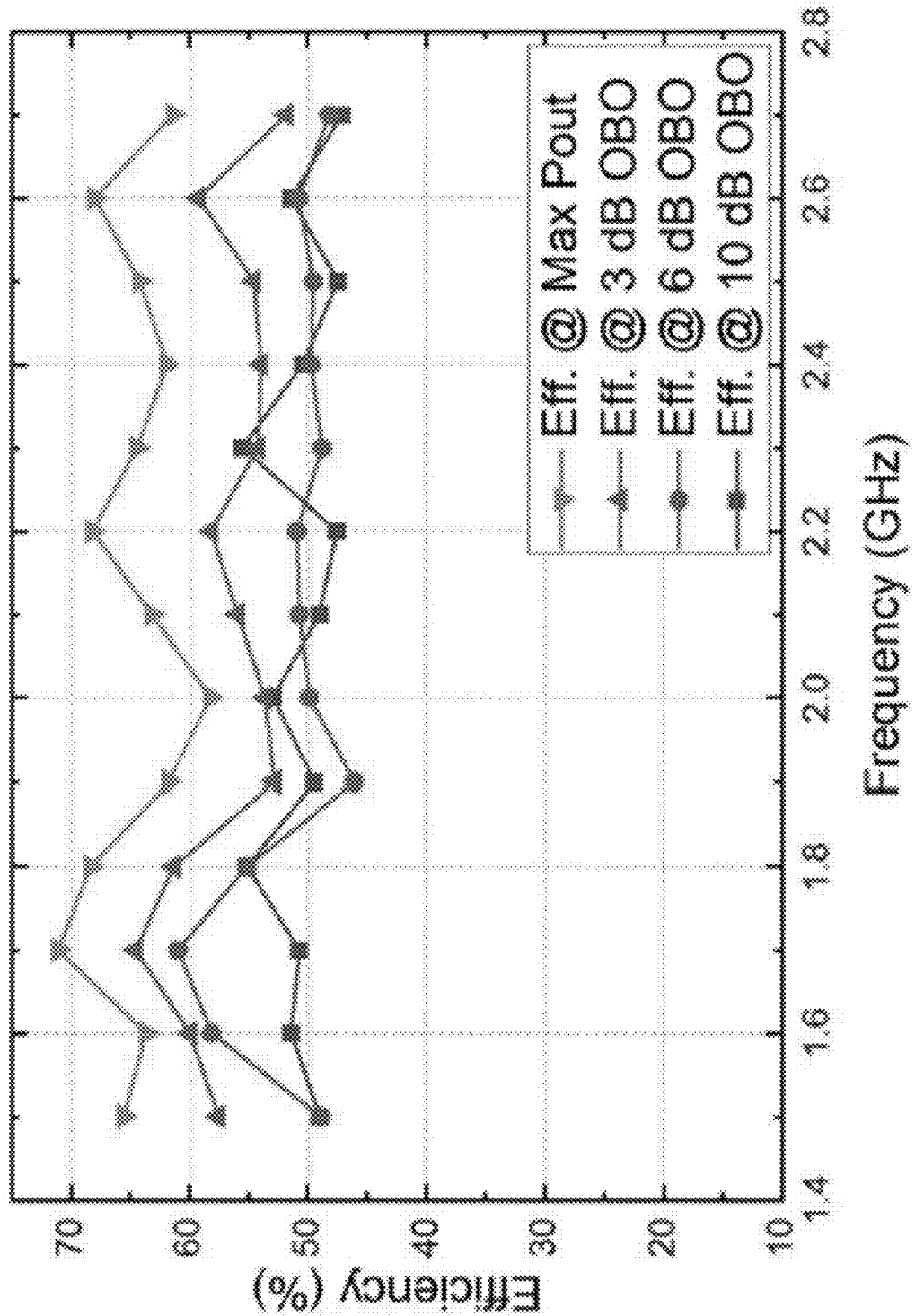
FIG. 18 illustrates measured power efficiency at different OBO levels from 1.5 to 2.7 GHz according to one implementation described herein.

A prototype implementation was measured under the excitation of a single-tone CW signal from 1.5 to 2.7 GHz at different OBO levels. FIG. 17 shows the maximum output power constantly above 41 dBm over the entire bandwidth. In FIG. 16, the efficiency at maximum power has a local maximum of 72% at 1.7 GHZ, and it remains higher than 58% throughout the entire frequency range. The efficiencies at 6- and 10-dB OBO are in the range of 48%-61% and 47%-58%, respectively. The efficiencies here are defined as the ratio between the output power and the total dc power applied to all three amplifiers (i.e., BA1 118, BA2 120, and CA 106 as shown in FIG. 1), as shown in the following:

$$\text{Efficiency} = \frac{P_{out}}{P_{DC,BA1} + P_{DC,BA2} + P_{DC,CA}}. \quad (10)$$

Figure 19:
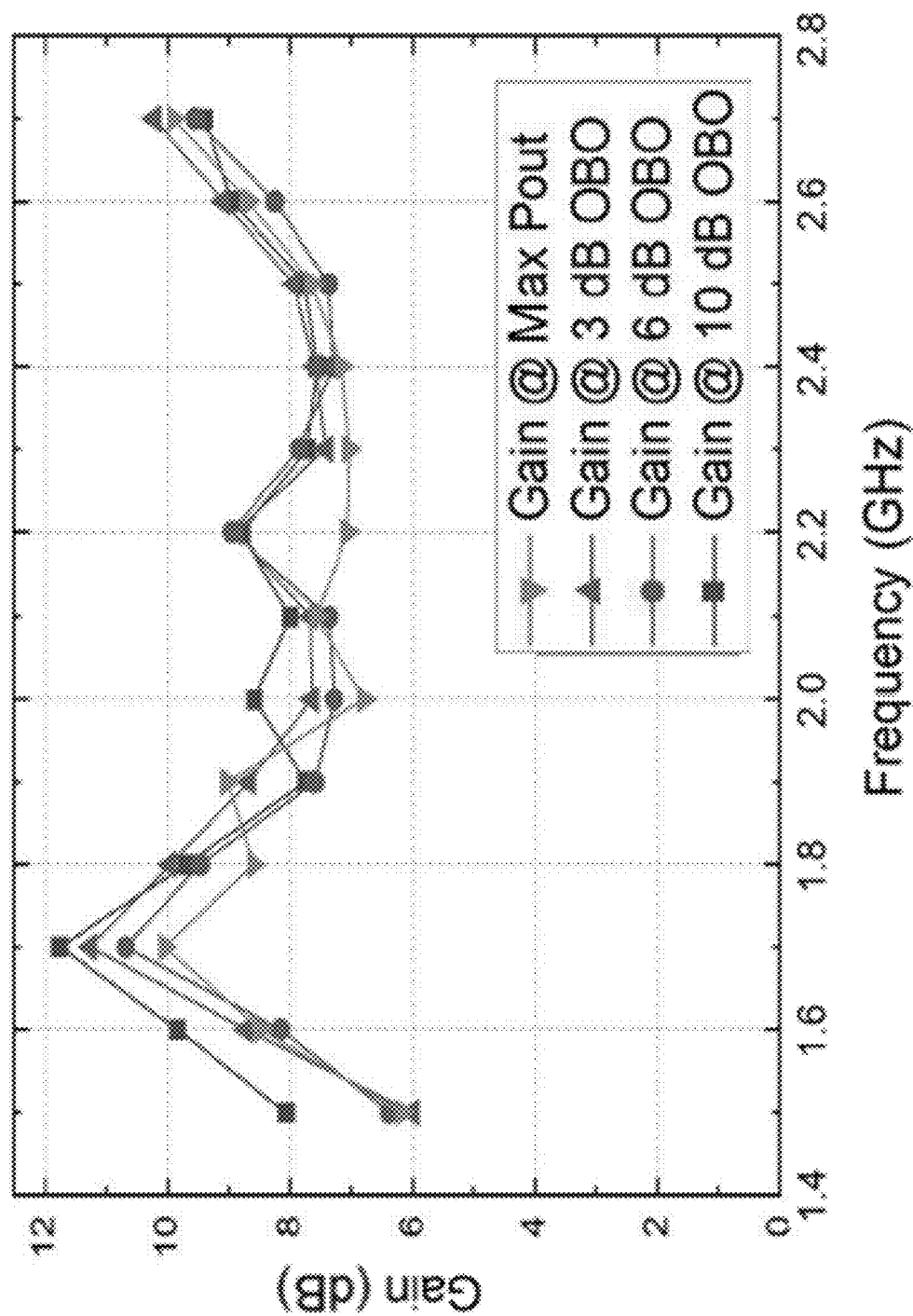
FIG. 19 illustrates measured gain at various OBO levels from 1.5 to 2.7 GHZ according to one implementation described herein.
Figure 20A:
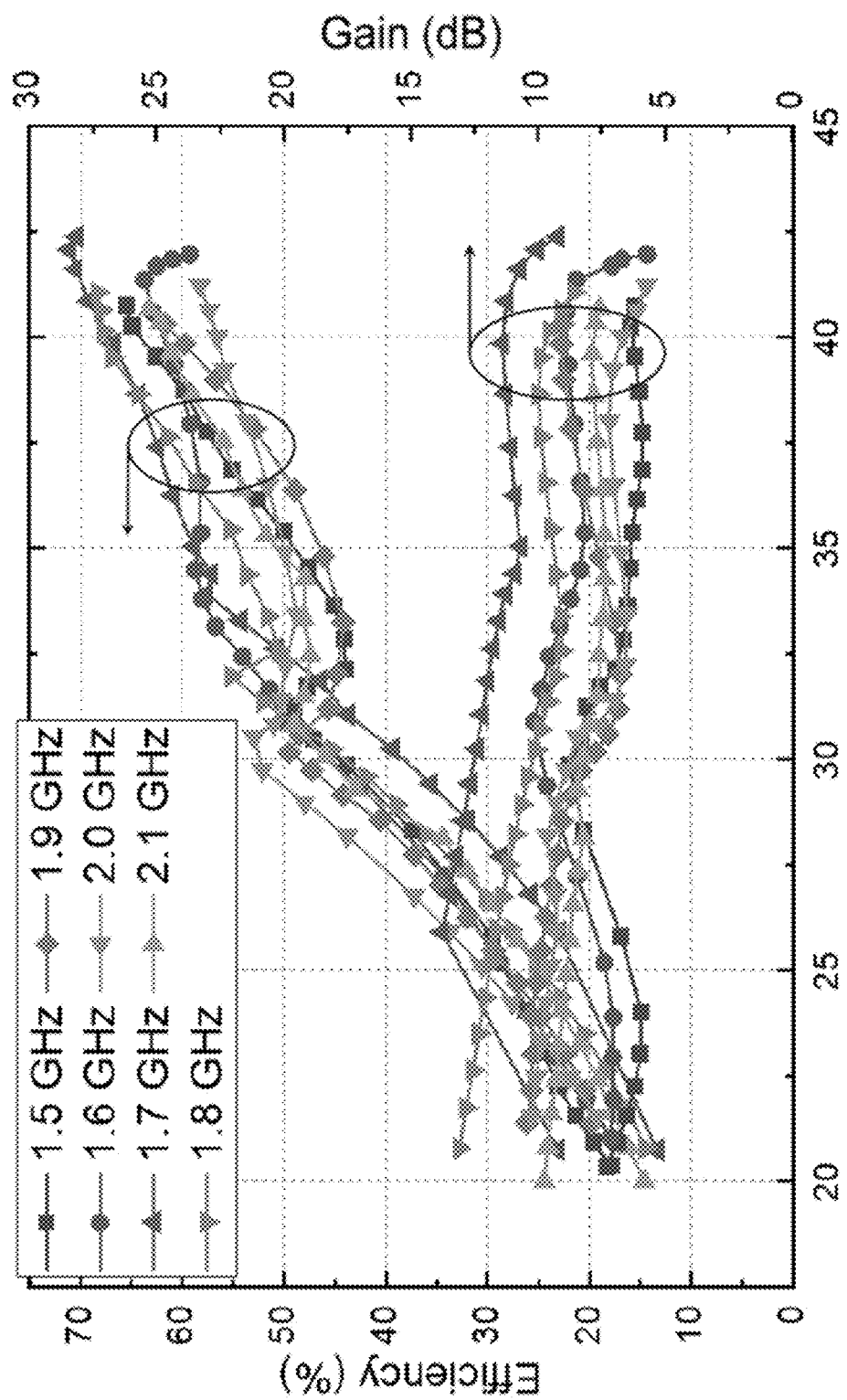
Figure 20B:
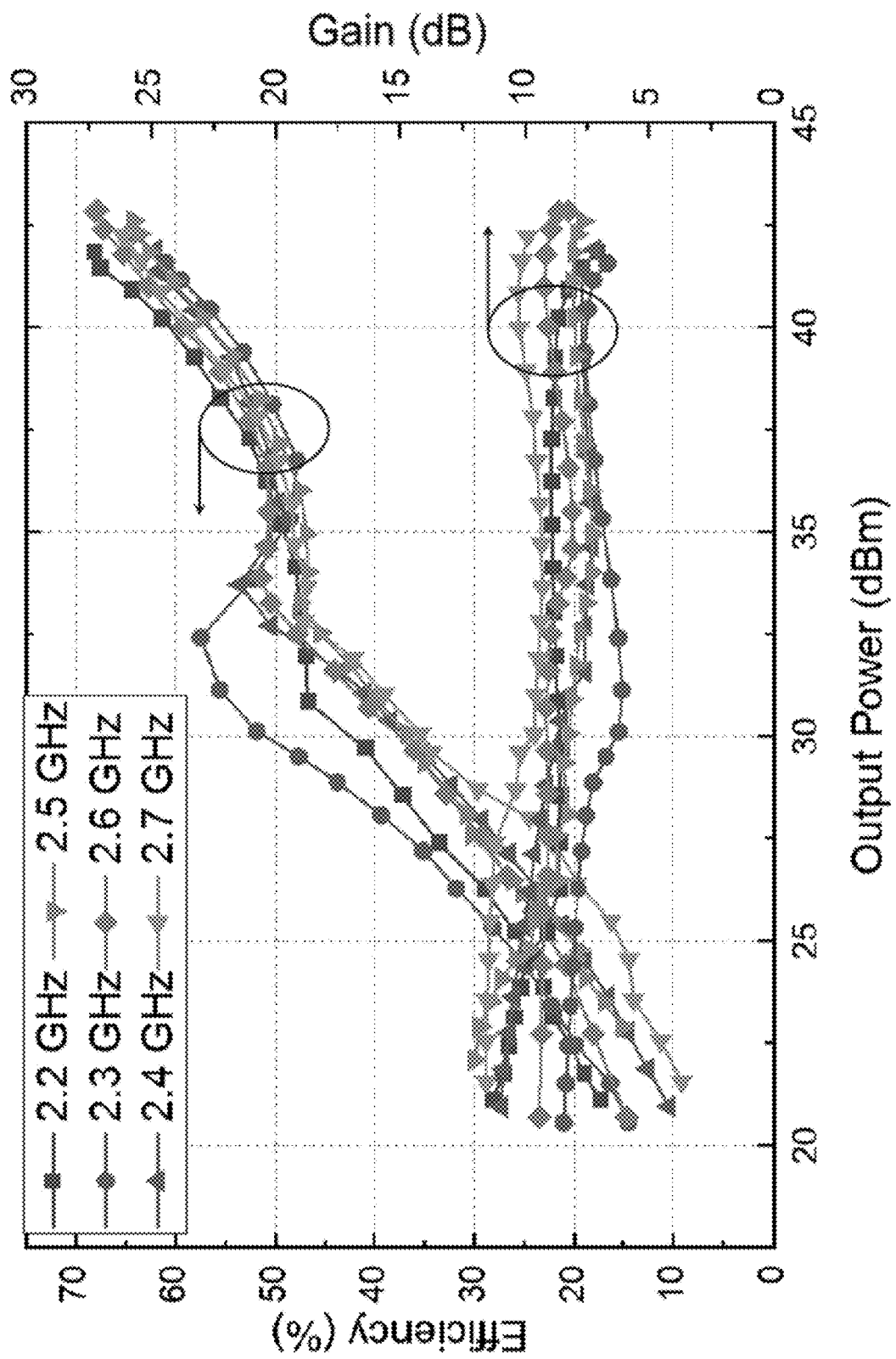

As shown in FIG. 19 that the gain of the example implementation can be maintained around 8-dB. In some embodiments of the present disclosure, the gain degradation at band edge and gain fluctuation over frequency can be mitigated with more design iterations. Moreover, the PD-LMBA prototype can be measured with a power-swept stimulus, and the measured efficiency and gain profiles of an example implementation are plotted in FIGS. 20A-20B. The shape of the efficiency versus output power curve in FIGS. 20A-20B shows a distinct Doherty-like behavior of the PA, which is demonstrated over 10-dB power back-off range at almost every single sample frequency point from 1.5 to 2.7 GHZ. These measurement results well validate the proposed PD-LMBA concept and demonstrate the advantage of this new technology in PA efficiency enhancement over a wide bandwidth. The results also indicate that the PD-LMBA is relieved from the original LMBA's reliance on dynamic phase adjustment at a single frequency.

FIG. 20C illustrates a comparison between an implementation of the present disclosure and other recently active-load-modulation PAs with a similar frequency range, output power level, and technology. Even though the simulated implementations and fabricated implementations described herein can differ, compare FIGS. 20A-20B and FIG. 12, showing where the measured efficiency drops in the non-limiting example implementations upper power regime at some frequencies, the measured efficiencies (at both $P_{Max}$ and various back-off levels) over a broad bandwidth still compare favorably to the state of the art.

Modulated Measurement

Figure 21:
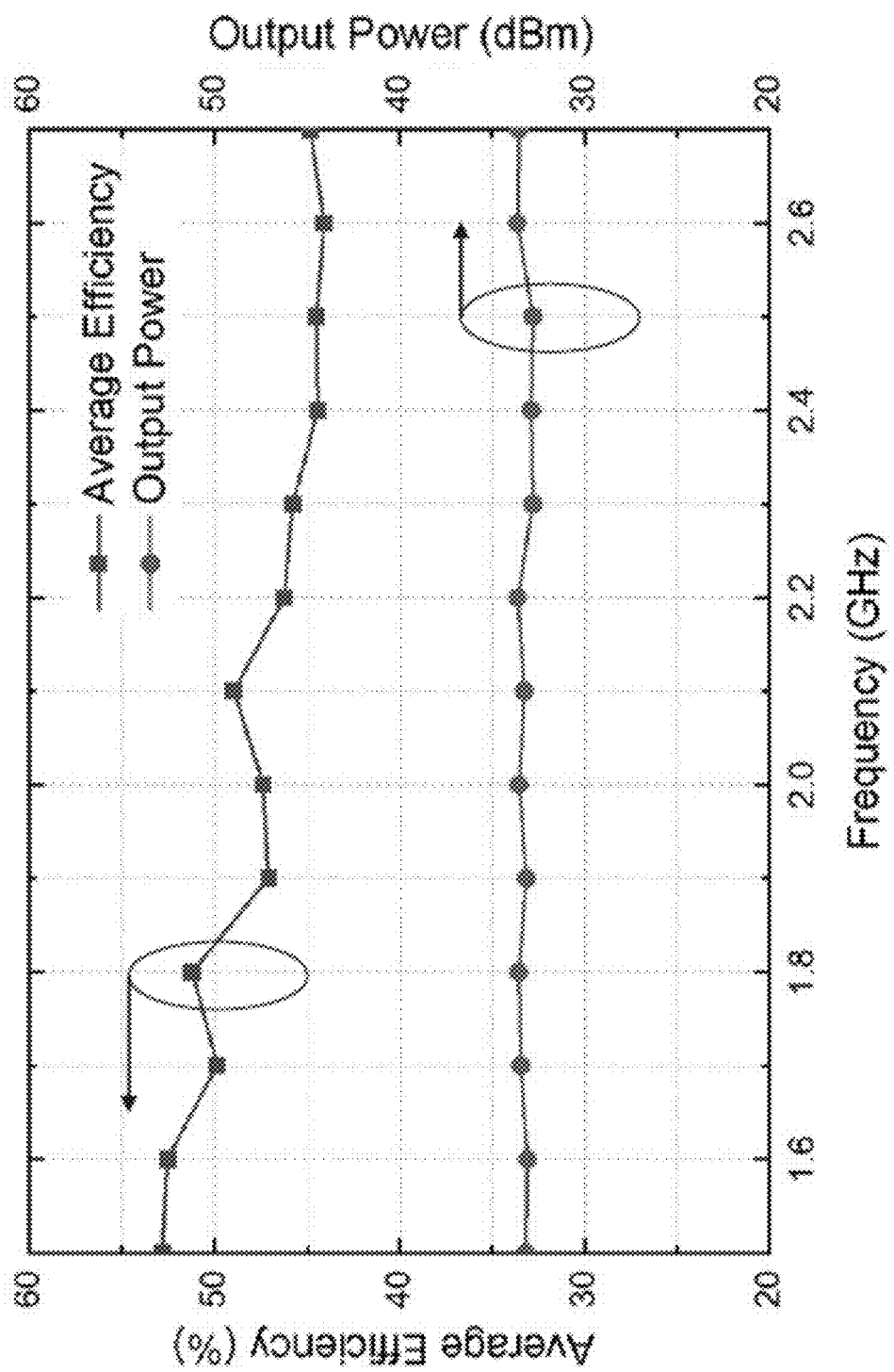
FIG. 21 illustrates measured output power and average efficiency with 9.5-dB-PAPR (peak to average ratio) LTE signal from 1.5 to 2.7 GHZ, according to one implementation described herein.
Figure 22:
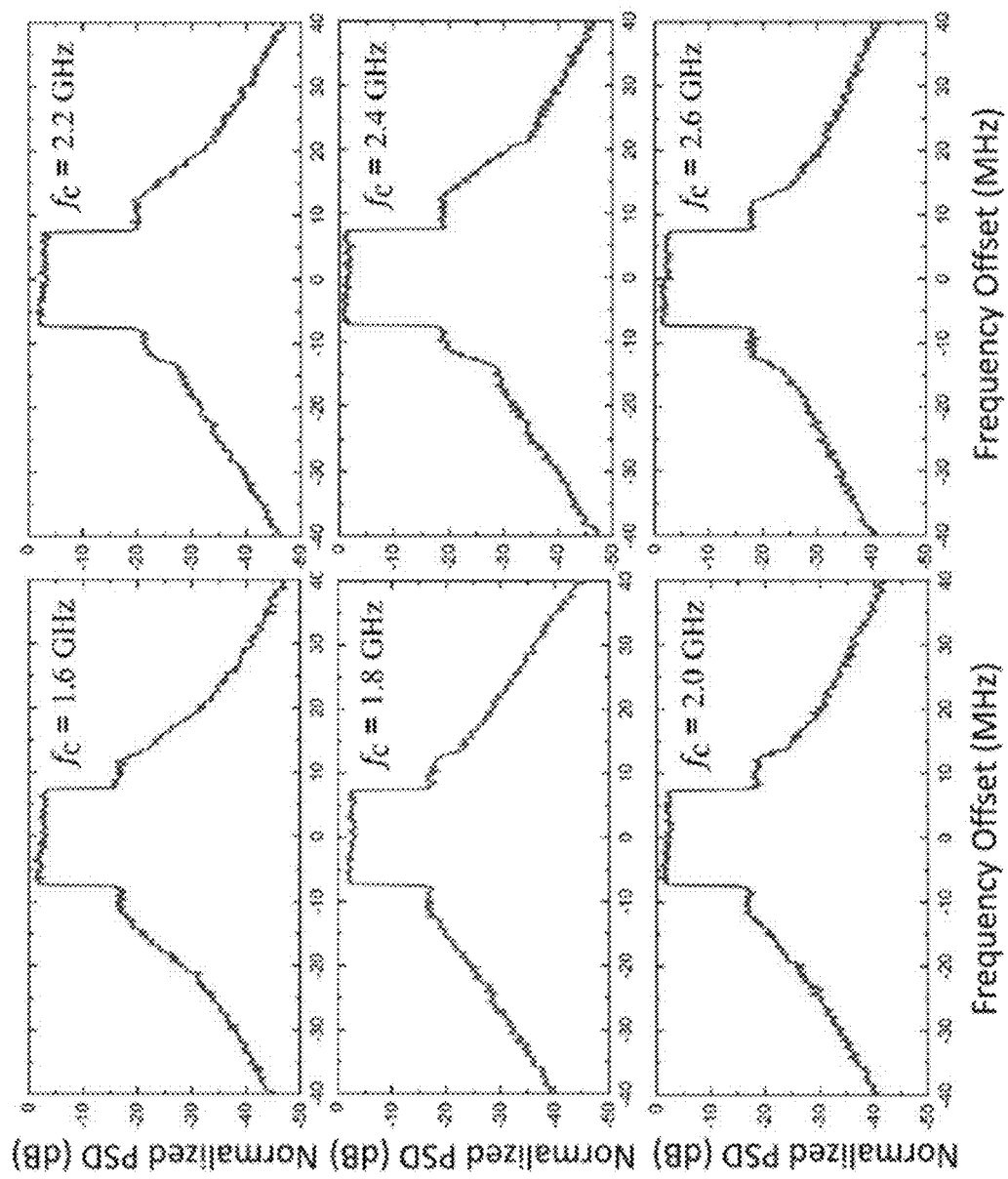
FIG. 22 illustrates the output spectrum from modulated measurement using a 10-MHz 9.5-dB-PAPR LTE signal centered at 1.6, 1.8, 2.0, 2.2, 2.4, and 2.6 GHz, according to implementations described herein.

To validate the operation of the designed PD-LMBA in realistic communications, a 10-MHz long term evolution (LTE) signal with a PAPR of 9.5 dB was employed as the stimulation for the example implementation. The modulated signal is generated and analyzed by a vector transceiver. In the present example, a vector transceiver VXT-M9421+ sold under the trademark Keysight PXIe was used. The generated LTE signal can be further boosted by a preamplifier to a sufficient level for driving the PD-LMBA. A non-limiting example preamplifier that can be used in some implementations is the ZHL-5 W-422. The measurement results at an average output power around 33.5 dBm are shown in FIG. 21. The PD-LMBA achieves a high average efficiency of 47%-58% over the target frequency band. The measured output power spectral density (PSD) is shown in FIG. 22. The best-case ACLR of 25.8 dB can be measured without any digital predistortion.

CONCLUSION

The example implementations of the present disclosure illustrate LMBAs with pseudo-Doherty load-modulation behavior. Based on a combination of CA (carrier) and BA (peaking), the implementations of the PD-LMBA architecture can allow decoupled cooperation of carrier and peaking amplifiers, thus fundamentally eliminating the bandwidth limitation imposed on classic active load-modulation techniques. Phase and amplitude controls can be used to achieve an optimal load-modulation behavior for PD-LMBA, leading to increased or maximized efficiency over an extended power back-off range. The disclosed efficiency optimization can be achieved with a static setting of phase offset at a given frequency, simplifying complexity for phase control. The measurement results using CW and modulated stimulus signals validate the proposed PD-LMBA theory and experimentally show improvements of efficiency, back-off range, and/or bandwidth across various implementations of the present disclosure. Thus, implementations of the disclosed designs and design methods can be used as a design paradigm for active load modulation.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A load-modulated balanced amplifier, comprising:
   a radio frequency (RF) input port;
   a RF output port;
   a peaking amplifier circuit operably coupled between the RF input and RF output ports, wherein the peaking amplifier circuit is a balanced amplifier that comprises a pair of power amplifiers, wherein the pair of power amplifiers of the peaking amplifier circuit are coupled through first and second quadrature couplers; and
   a carrier amplifier circuit operably coupled between the RF input port and directly coupled to an isolation port of the second quadrature coupler.

2. The load-modulated balanced amplifier of claim 1, wherein the carrier amplifier circuit is configured to provide gain at any power level of an input RF signal.

3. The load-modulated balanced amplifier of claim 1, wherein the peaking amplifier circuit is configured to provide gain only at peak power levels of an input RF signal.

4. The load-modulated balanced amplifier of claim 1, wherein the load-modulated balanced amplifier is configured for load modulation from peak power to a predefined output power back-off.

5. The load-modulated balanced amplifier of claim 1, wherein the pair of power amplifiers are coupled 90° out-of-phase through the first and second quadrature couplers.

6. The load-modulated balanced amplifier of claim 1, wherein an input port of the first quadrature coupler is configured to receive an input RF signal.

7. The load-modulated balanced amplifier of claim 1, wherein each of the first and second quadrature couplers is a branch-line coupler, a coupled-line coupler, a Lange coupler, a transformer-based coupler, or a lumped coupler comprising inductors and capacitors.

8. The load-modulated balanced amplifier of claim 1, further comprising a phase shifter, wherein the peaking amplifier circuit is operably coupled to the RF input through the phase shifter.

9. The load-modulated balanced amplifier of claim 8, wherein the phase shifter is a transmission line that is configured to provide an optimal frequency-dependent phase offset between the carrier and peaking amplifier circuits over an operational frequency range.

10. The load-modulated balanced amplifier of claim 9, wherein a relative phase difference between the carrier and peaking amplifier circuits is offset by a given length of the transmission line.

11. The load-modulated balanced amplifier of claim 8, wherein the phase shifter is a fixed or tunable phase shifter.

12. The load-modulated balanced amplifier of claim 11, wherein the phase shifter comprises at least one of a transmission line, a bandpass filter, a low-pass filter, a high-pass filter, or a network comprising inductors, capacitors, and/or resistors.

13. The load-modulated balanced amplifier of claim 1, further comprising a power divider, wherein the power divider is configured to split an input RF signal between the carrier and peaking amplifier circuits.

14. The load-modulated balanced amplifier of claim 1, wherein the carrier amplifier circuit comprises a Class AB power amplifier.

15. The load-modulated balanced amplifier of claim 1, wherein the carrier amplifier circuit comprises a Class A power amplifier or a Class B power amplifier.

16. The load-modulated balanced amplifier of claim 1, wherein each of the pair of power amplifiers of the peaking amplifier circuit is a Class C power amplifier.

* * * * *